(12) United States Patent
Tamimoto et al.

(10) Patent No.: US 7,863,107 B2
(45) Date of Patent: Jan. 4, 2011

(54) SEMICONDUCTOR DEVICE AND MANUFACTURING METHOD OF THE SAME

(75) Inventors: Hideaki Tamimoto, Tokyo (JP); Takumi Soba, Tokyo (JP); Toru Ueguri, Tokyo (JP); Kazuo Kudo, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/334,318

(22) Filed: Dec. 12, 2008

(65) Prior Publication Data

US 2009/0152697 A1   Jun. 18, 2009

(30) Foreign Application Priority Data

Dec. 14, 2007   (JP)   ............... 2007-322808

(51) Int. Cl.
*H01L 21/00* (2006.01)
(52) U.S. Cl. .................. 438/123; 257/676; 257/784; 438/120
(58) Field of Classification Search .......... 257/676, 257/784; 438/123, 120
See application file for complete search history.

(56) References Cited

U.S. PATENT DOCUMENTS 6,858,943 B1 *   2/2005   Peterson et al. ............. 257/784

2005/0269694 A1   12/2005   Luechinger
2006/0118932 A1 *   6/2006   Nanba et al. ................. 257/678

FOREIGN PATENT DOCUMENTS

JP   2004-336043 A   11/2004
JP   2006-196629 A   7/2006

* cited by examiner

*Primary Examiner*—Zandra Smith
*Assistant Examiner*—Jamie Niesz
(74) *Attorney, Agent, or Firm*—Miles & Stockbridge P.C.

(57) ABSTRACT

The bonding time of a metallic ribbon is shortened in the semiconductor device which connects a lead frame with the bonding pad of a semiconductor chip with a metallic ribbon. The bottom of the wedge tool is divided into two by the V-groove at the first branch and the second branch. In order to do bonding of the Al ribbon to the source pad of the silicon chip, and the source post of the lead frame, first, the first branch and second branch of the wedge tool are contacted by pressure to Al ribbon on the source pad, and supersonic vibration is applied to it. Subsequently, the first branch is contacted by pressure to Al ribbon on the source post, and supersonic vibration is applied to it. Here, since the width of the first branch is narrower than the width of the source post, Al ribbon is not joined at the end surface of the width direction of the source post.

15 Claims, 30 Drawing Sheets

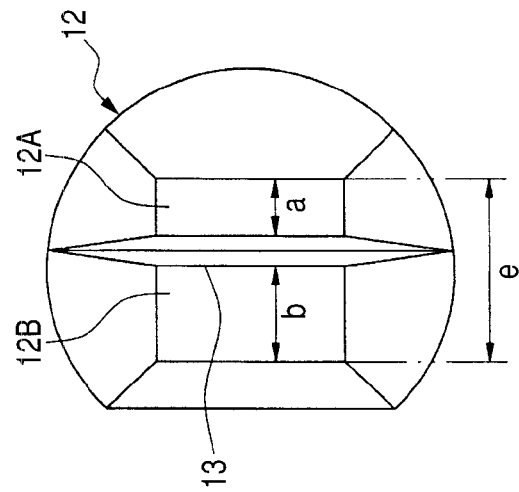
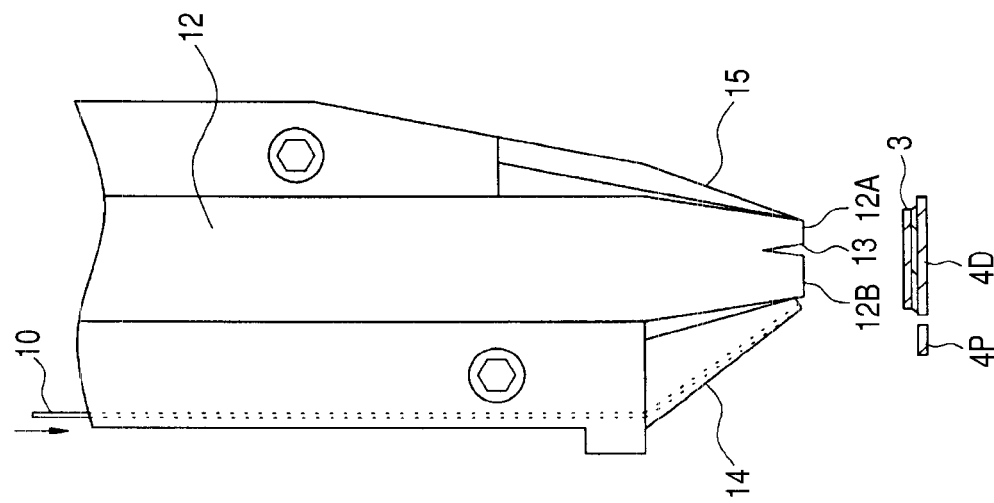

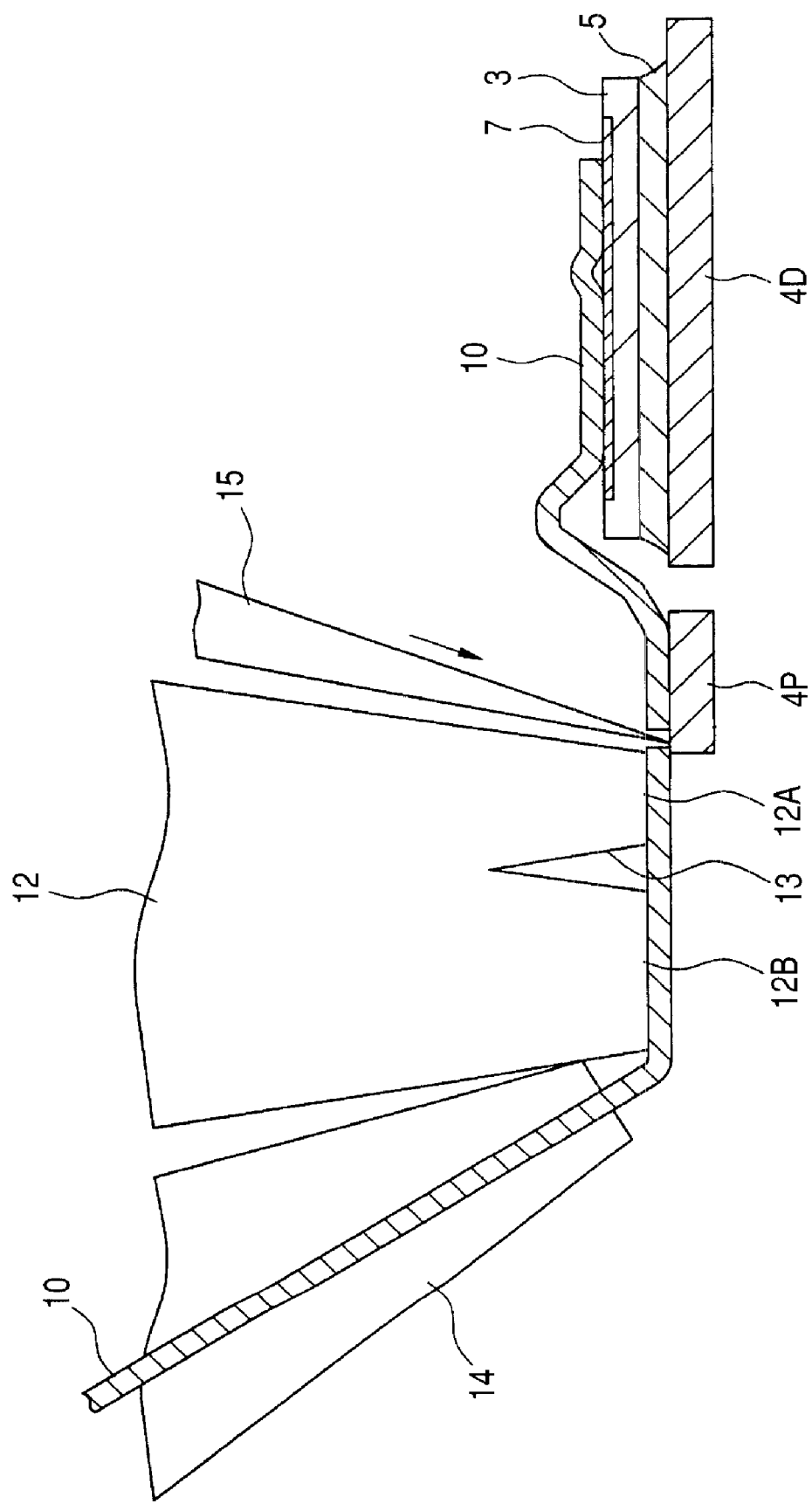

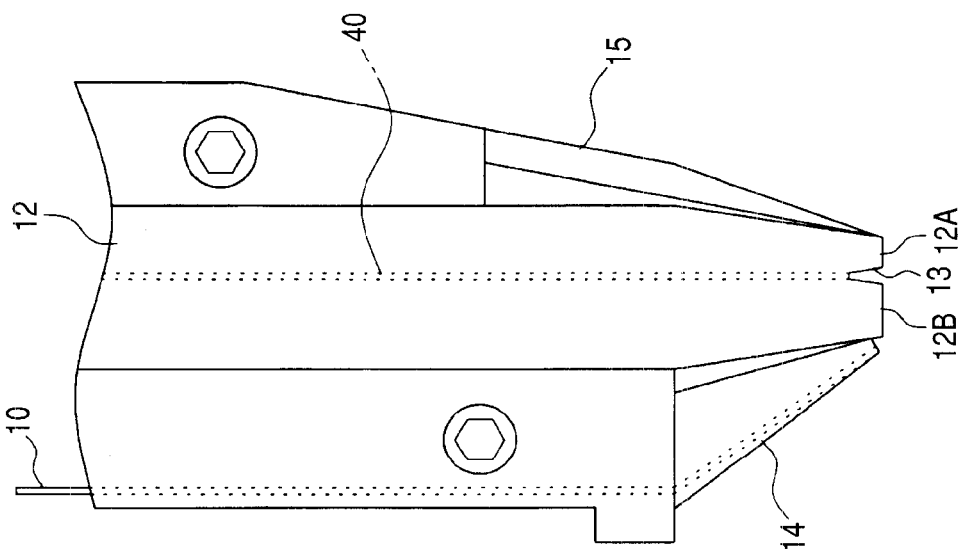
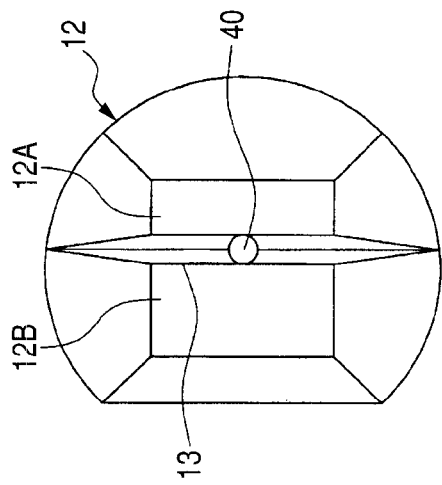
FIG. 24(a)
FIG. 24(b)

SEMICONDUCTOR DEVICE AND MANUFACTURING METHOD OF THE SAME

CROSS-REFERENCE TO RELATED APPLICATION

The present application claims priority from Japanese patent application No. 2007-322808 filed on Dec. 14, 2007, the content of which is hereby incorporated by reference into this application.

FIELD OF THE INVENTION

The present invention relates to a semiconductor device and its manufacturing technology, and particularly relates to an effective technology in the application to the semiconductor device which connects a lead frame with the bonding pad of the semiconductor chip sealed in the surface mounting package with a metallic ribbon.

DESCRIPTION OF THE BACKGROUND ART

Power MOSFET (Metal Oxide Semiconductor Field Effect Transistor) used for a power control switch, a charge-and-discharge protection circuit switch, etc. of a portable information device, and Insulated Gate Bipolar Transistor (IGBT) are sealed in small surface mounting packages, such as SOP8. For example, the general structure of publicly known SOP8 where power MOSFET was sealed is as follows.

On the die pad part of the lead frame, the semiconductor chip sealed with mold resin is mounted, where the main surface is turned upwards. The back surface of the semiconductor chip constitutes the drain of power MOSFET, and is joined to the die pad part via electroconductive adhesives, such as Ag paste. The source pad connected to the source of power MOSFET and the gate pad connected to the gate electrode are formed in the top layer of the main surface of the semiconductor chip. The source pad is formed in the area wider than the gate pad, in order to reduce the on resistance of power MOSFET. With the same reason, as for the back surface of the semiconductor chip, the whole surface constitutes the drain of power MOSFET.

A plurality of leads which constitute the external connection terminal of SOP8 are exposed to the outside of mold resin. These leads consist of a source lead, a drain lead, and a gate lead. The gate lead is electrically connected with the gate pad by one Au wire, and the source lead is electrically connected with the source pad by a plurality of Au wires. The drain lead is formed in one with the die pad part. The drain lead is electrically connected with the back surface (drain of power MOSFET) of the semiconductor chip mounted on this die pad part.

However, SOP8 of the above structures is difficult to fully lower the source resistance of power MOSFET. Since the cross-section area of the Au wire which connects a source lead with a source pad is small, this is because it is difficult to secure sufficient connection area to a source pad even if the number of an Au wire is increased. In this case, since the size of the silicon chip will also become large when area of the source pad tends to be enlarged and it is going to connect many Au wires, package size will become large. Since much time is needed for the bonding of an Au wire, the problem that the productivity of SOP8 falls is also generated.

Then, technology of connecting a source lead with a source pad is put in practical use in recent years using a metallic ribbon with flexibility which was described, for example to Japanese patent laid-open No. 2004-336043 (Patent Reference 1). Although this metallic ribbon comprises Al foil, Cu foil, etc. whose thickness is about hundreds μm, for example and the width changes also with width of a source pad, generally it is around 1 mm. In order to connect a metallic ribbon to a source pad and a source lead, the wedge-bonding method using supersonic vibration is used.

Since the width of the ribbon is quite large compared with the diameter of an Au wire, there is an advantage of the above-mentioned metallic ribbon in the ability of at least one metallic ribbon to secure sufficient connection area to a source pad. Since a ribbon is constituted from Al cheaper than Au, it is effective in the material cost of SOP8 being reduced.

Japanese patent laid-open No. 2006-196629 (Patent Reference 2) is disclosing the improvement technology of the wedge tool used for connection of the above-mentioned metallic ribbon. A plurality of trenches or notches are formed in the under surface of the wedge tool described in this official report along the direction parallel to the extending direction of the metallic ribbon. Therefore, when this wedge tool is contacted by pressure to the metallic ribbon arranged on a semiconductor chip, a part of under surface of the tool will contact the metallic ribbon. Since excessive ultrasonic vibration energy can be prevented from being transmitted from the wedge tool to the front surface of the semiconductor chip by this, the defect which breakage of a crack, a crack, etc. generates in a semiconductor chip is reduced.

[Patent Reference 1] Japanese patent laid-open No. 2004-336043

[Patent Reference 2] Japanese patent laid-open No. 2006-196629

SUMMARY OF THE INVENTION

The present inventor examined the wedge tool used for connection of the above-mentioned metallic ribbon. FIG. 28A is a side view showing the neighborhood of a point of the wedge tool which the present inventor examined, and FIG. 28B is the plan view which observed the point of this wedge tool from the lower part. Al ribbon was used as a metallic ribbon and the silicon chip with which power MOSFET was formed was used as a semiconductor chip.

As shown in FIG. 28A, the ribbon guide 14 is attached to one side surface of the wedge tool 18, and the Al ribbon 10 passing through the inside of this ribbon guide 14 is sent out to the point of the wedge tool 18. The cutter 15 which cuts the Al ribbon 10 sent out to the point of the wedge tool 18 is attached to another side surface of the wedge tool 18 so that up-and-down motion is possible. The reference 3 in a figure is the silicon chip with which power MOSFET was formed, 19D is the die pad part on which this silicon chip 3 was mounted, and 19S is a source lead.

As shown in FIG. 28B, the bottom of the wedge tool 18 is a flat surface which has a rectangular plane form. This bottom is formed so that the length (f) of the shorter side may become narrower than the width (c) of the source lead 19S shown in FIG. 28A.

Bonding of the Al ribbon 10 is done to the silicon chip 3 and the source lead 19S using the above-mentioned wedge tool 18. First, as shown in FIG. 29, the point of the Al ribbon 10 sent out from the ribbon guide 14 is positioned on the source pad 7 of the silicon chip 3. Then, the bottom of the wedge tool 18 is contacted by pressure to the Al ribbon 10, and supersonic vibration is applied. Hereby, the Al ribbon 10 of the region adjacent to the bottom of the wedge tool 18 is joined to the front surface of the source pad 7.

Next, as shown in FIG. 30, after moving the wedge tool 18, the bottom is contacted by pressure to the Al ribbon 10 once again, and supersonic vibration is applied. Hereby, the Al ribbon 10 of the region adjacent to the bottom of the wedge tool 18 is joined to the front surface of the source pad 7. Thus, the connection area of the Al ribbon 10 and the source pad 7 is securable by doing wedge bonding of the Al ribbon 10 at two places of the source pad 7.

Next, as shown in FIG. 31, after moving the wedge tool 18 further and positioning the center of the bottom at the center of the source lead 19S, the bottom of the wedge tool 18 is contacted by pressure to the Al ribbon 10 on the source lead 19S, and supersonic vibration is applied to it. Hereby, the Al ribbon 10 of the region adjacent to the bottom of the wedge tool 18 is joined to the front surface of the source lead 19S. However, since the bottom of the wedge tool 18 is formed more narrowly than the width of the source lead 19S as shown in FIG. 28B, the Al ribbon 10 is not joined to the end surface of the source lead 19S.

Next, as shown in FIG. 32, on the end portion of the source lead 19S, the cutter 15 is positioned and is descended. The Al ribbon 10 of a region which is not joined to the source lead 19S is cut by this, and the work which connects the Al ribbon 10 with the source pad 7 and the source lead 19S is completed.

However, to use the above wedge tools 18, it is necessary to secure the connection area of the Al ribbon 10 and the source pad 7. Therefore, since bonding of the Al ribbon 10 must be done at two places of the source pad 7, much time is needed for bonding.

Ultrasonic vibration energy required for the bonding of the Al ribbon 10 is larger than ultrasonic vibration energy required for the bonding of an Au wire. Therefore, since excessive ultrasonic vibration energy will travel to electroconductive adhesives, such as Ag paste which intervenes between the silicon chip 3 and the die pad part 19D, when bonding of the Al ribbon 10 is done at two places of the source pad 7, there is a possibility that breakage of a crack, a crack, etc. may generate also in electroconductive adhesive.

As the measure, as shown, for example in FIG. 33, area of the bottom of the wedge tool 18 tends to be enlarged and it is going to secure the connection area of the Al ribbon 10 and the source pad 7 with 1 time of bonding. Then, as shown in FIG. 34, when bonding of the Al ribbon 10 is done to the front surface of the source lead 19S whose width is narrower than the source pad 7, the Al ribbon 10 will be joined to the whole front surface of the source lead 19S. Therefore, the problem that the excessive Al ribbon 10 cannot peel from the front surface of the source lead 19S even if the cutter 15 cuts the Al ribbon 10 of the end portion of the source lead 19S generates.

A purpose of the present invention is to provide the technology in which the bonding time of a metallic ribbon can be shortened in the semiconductor device which connects a lead frame with the bonding pad of a semiconductor chip with a metallic ribbon.

Another purpose of the present invention is in providing the technology which can suppress the drop of a manufacturing yield and reliability resulting from the excessive ultrasonic vibration energy applied at the time of the bonding of a metallic ribbon in the semiconductor device which connects the bonding pad of a semiconductor chip and lead frame with a metallic ribbon.

The above-described and the other purposes and novel features of the present invention will become apparent from the description herein and accompanying drawings.

Of the inventions disclosed in the present application, typical ones will next be summarized briefly.

The semiconductor device of the present invention comprises:

a lead frame having a die pad part and a first lead arranged near the die pad part;

a semiconductor chip mounted over the die pad part;

a metallic ribbon electrically connecting a first pad formed in a front surface of the semiconductor chip, and the first lead; and a resin sealing the semiconductor chip, the first lead, and the metallic ribbon;

wherein the metallic ribbon is connected to the first pad in a first junction and a second junction of a front surface of the first pad; and a connection area of the metallic ribbon and the first pad in the first junction differs from a connection area of the metallic ribbon and the first pad in the second junction.

The manufacturing method of the semiconductor device of the present invention comprises the steps of:

(a) providing a lead frame which has a die pad part, and a first lead arranged near the die pad part;

(b) providing a semiconductor chip in which a first pad is formed in a front surface;

(c) mounting the semiconductor chip over the die pad part;

(d) electrically connecting one end of a metallic ribbon to a front surface of the first pad, and electrically connecting the other end of the metallic ribbon to a front surface of the first lead by a wedge-bonding method using supersonic vibration; and (e) sealing the semiconductor chip, the first lead, and the metallic ribbon with a resin;

wherein in the step (d), a point of a wedge tool which applies the supersonic vibration to the metallic ribbon over an each front surface of the first pad and the first lead is branched by a long groove extending in a first direction which intersects perpendicularly with a direction which tends toward the first lead from the first pad.

Al ribbon as used in the present invention means a beltlike connection material which comprised a conductive material which uses Al as a principal component. Usually, Al ribbon is installed in a bonding device in the state where it was wound around the spool. There are ultrasonic jointing and laser jointing as a method which connects Al ribbon to a lead or a pad. Since Al ribbon is very thin, when connecting it with a lead or a pad, the length and the loop shape can be set up arbitrarily.

Advantages achieved by some of the most typical aspects of the invention disclosed in the present application will be briefly described below.

In the semiconductor device which connects a lead frame with the bonding pad of a semiconductor chip with a metallic ribbon, it becomes possible to shorten the bonding time of a metallic ribbon.

In the semiconductor device which connects a lead frame with the bonding pad of a semiconductor chip with a metallic ribbon, it becomes possible to suppress the drop of a manufacturing yield and reliability resulting from the excessive ultrasonic vibration energy applied at the time of the bonding of a metallic ribbon.

BRIEF DESCRIPTION OF THE DRAWINGS

FIG. 10A is a side view showing the neighborhood of a point of the wedge tool with which the wedge bonder used for the bonding of Al ribbon was equipped, and FIG. 10B is the plan view which observed the point of this wedge tool from the lower part;

FIG. 13 is a principal part cross-sectional view showing the manufacturing method of the semiconductor device following FIG. 12;

FIG. 24A is a side view showing the neighborhood of a point of the wedge tool used in other embodiment of the present invention, and FIG. 24B is the plan view which observed the point of this wedge tool from the lower part;

DETAILED DESCRIPTION OF THE PREFERRED EMBODIMENTS

Figure 1:
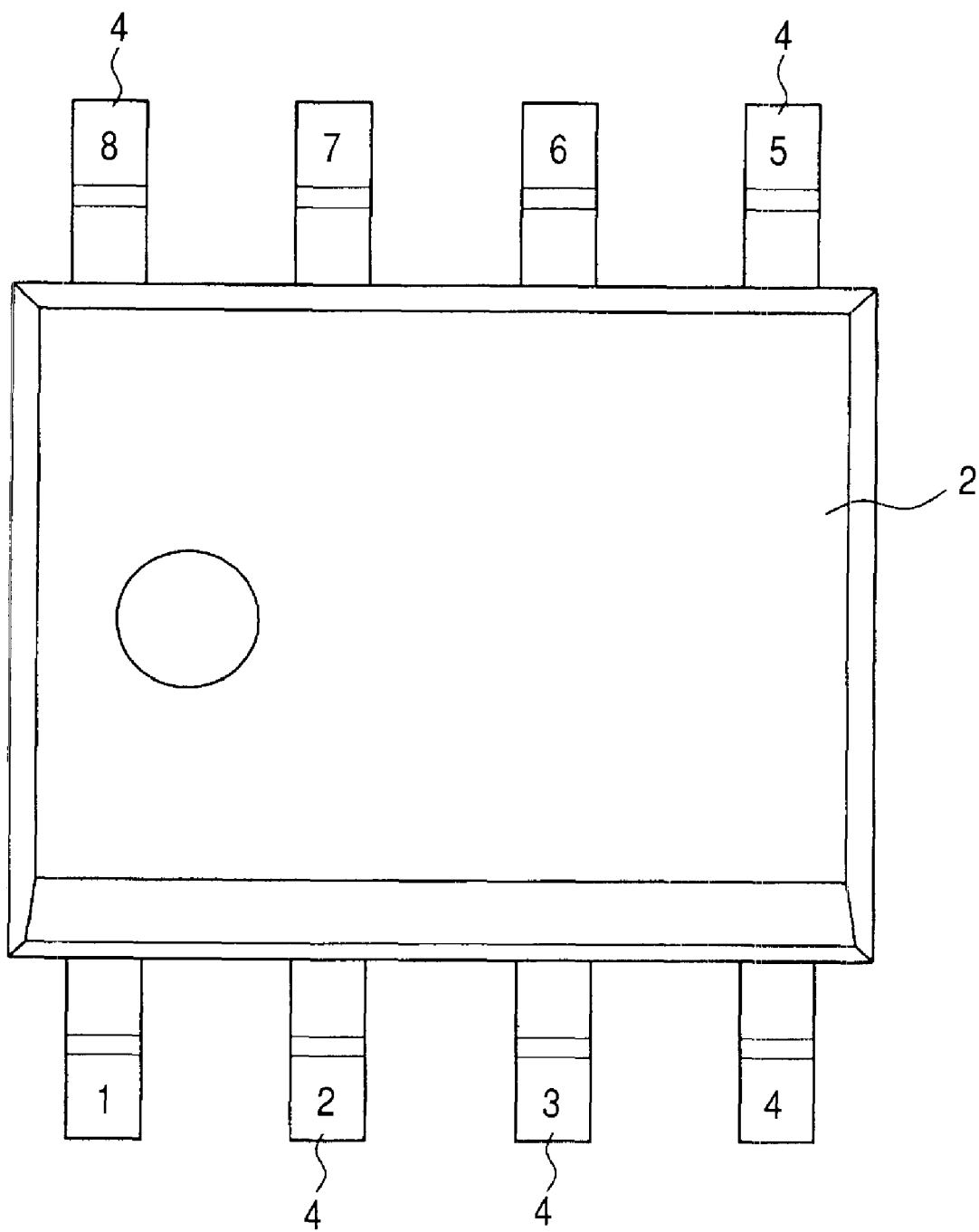
FIG. 1 is a plan view showing the appearance of the semiconductor device which is the 1 embodiment of the present invention.

Hereafter, embodiments of the invention are explained in detail based on drawings. In all the drawings for describing the embodiments, members of a like function will be identified by like reference numerals in principle and overlapping descriptions will be omitted.

Al ribbon as used in following embodiments means a belt-like connection material which comprised a conductive material which uses Al as a principal component. Usually, Al ribbon is installed in a bonding device in the state where it was wound around the spool. Since Al ribbon is very thin, when connecting it with a lead or a pad, it can set up length and loop shape arbitrarily.

There are some which are called a clip as a connection material similar to Al ribbon. This forms beforehand the thin metal plate which consists of a Cu alloy, Al, etc. to predetermined loop shape and predetermined length. When connecting this to a lead or a pad, while placing the one end on a lead, the other end is placed on a pad. A clip and a lead, and a clip and a pad are connected simultaneously. As a connection type, there are a soldering joint, Ag paste junction, ultrasonic jointing, etc.

The ribbon as used in the present invention means the connection material including the above-mentioned clip. The ribbon which can set up length and loop shape arbitrarily according to a lead, the area of a pad, or the distance of a lead and a pad is more preferred than the clip with which length and loop shape were decided beforehand.

Embodiment 1

Figure 2:
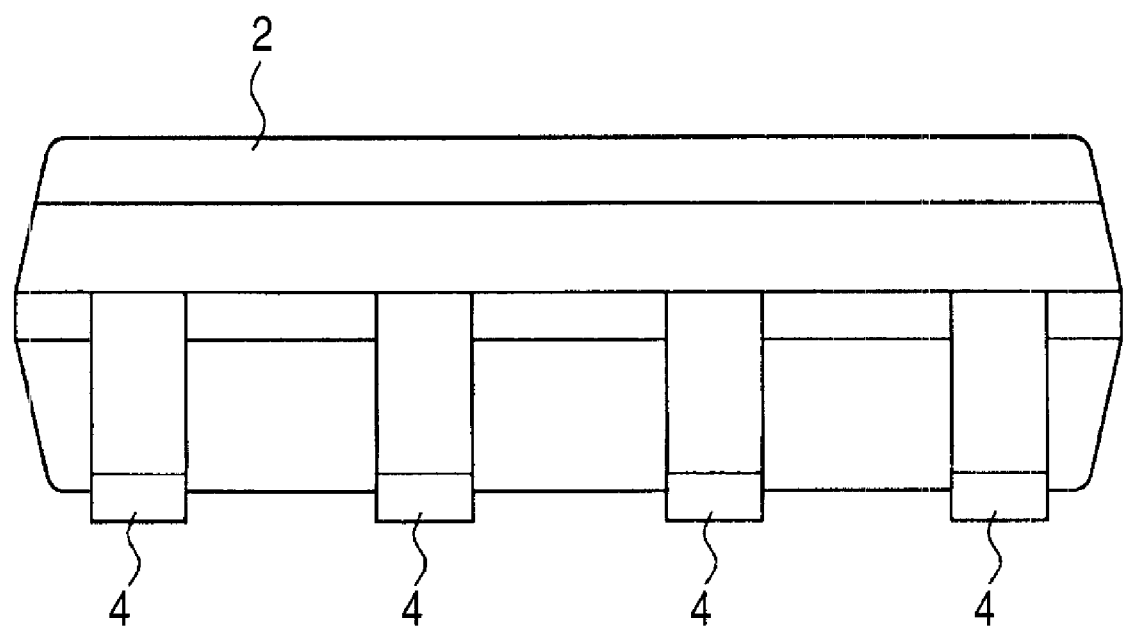
FIG. 2 is a side view showing the appearance of the semiconductor device which is the 1 embodiment of the present invention.
Figure 4:
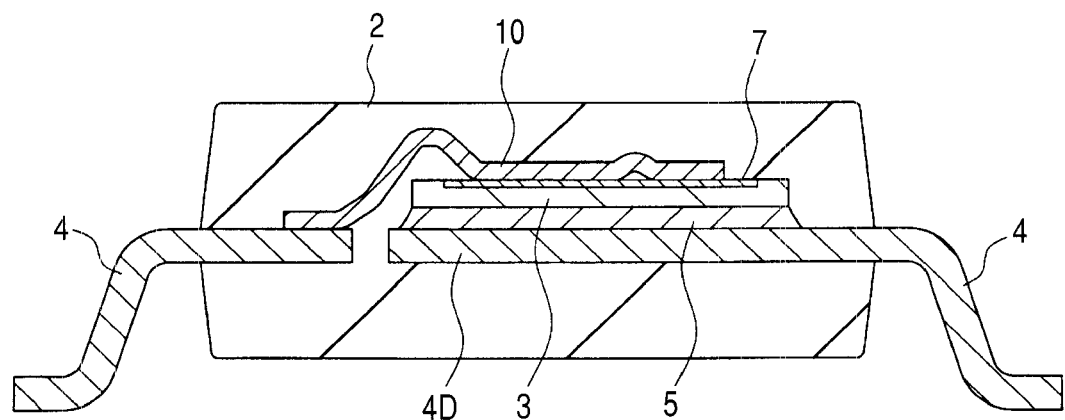
FIG. 4 is the cross-sectional view which took along the A-A line of FIG. 3.
Figure 5:
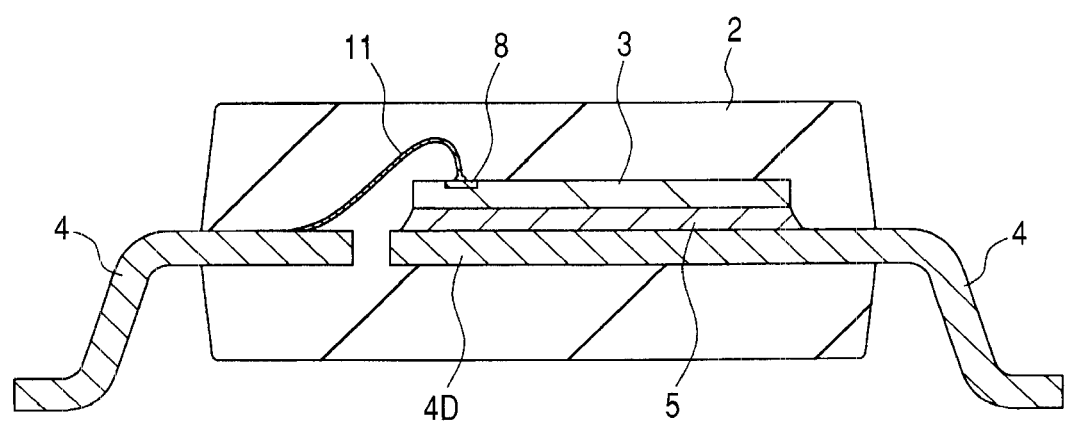
FIG. 5 is the cross-sectional view which took along the B-B line of FIG. 3.

The semiconductor device of this embodiment is applied to "SOP8" which is a kind of a small surface mounting package. FIG. 1 is a plan view showing the appearance of SOP8 of this embodiment, FIG. 2 is a side view showing the appearance of this SOP8, FIG. 3 is a plan view showing the internal structure of this SOP8, FIG. 4 is the cross-sectional view which took along the A-A line of FIG. 3, and FIG. 5 is the cross-sectional view which took along the B-B line of FIG. 3.

The outer lead portion of the eight leads 4 which constitute the external connection terminal of SOP8 is exposed to the outside of the mold resin 2 which consists of epoxy system resin to which impregnation of the silicon filler was done. Among the leads 4 shown in FIG. 1, the No. 1 lead to the No. 3 lead is a source lead, the No. 4 lead is a gate lead, and the No. 5 lead to the No. 8 lead is a drain lead.

The silicon chip 3 is sealed inside the mold resin 2. The plane size of the silicon chip 3 is long side X shorter side=3.9 mm×2.2 mm, for example. Power MOSFET used, for example for a power control switch, a charge-and-discharge protection circuit switch, etc. of a portable information device is formed in the main surface of the silicon chip 3. On the die pad part 4D formed in one with the four leads 4 (the No. 5 lead-the No. 8 lead) which constitute a drain lead, the silicon chip 3 is mounted, where the main surface is turned upwards. The die pad part 4D and the lead 4 (the No. 1 lead-the No. 8 lead) of eight consist of a Cu or Fe—Ni alloy.

Figure 3:
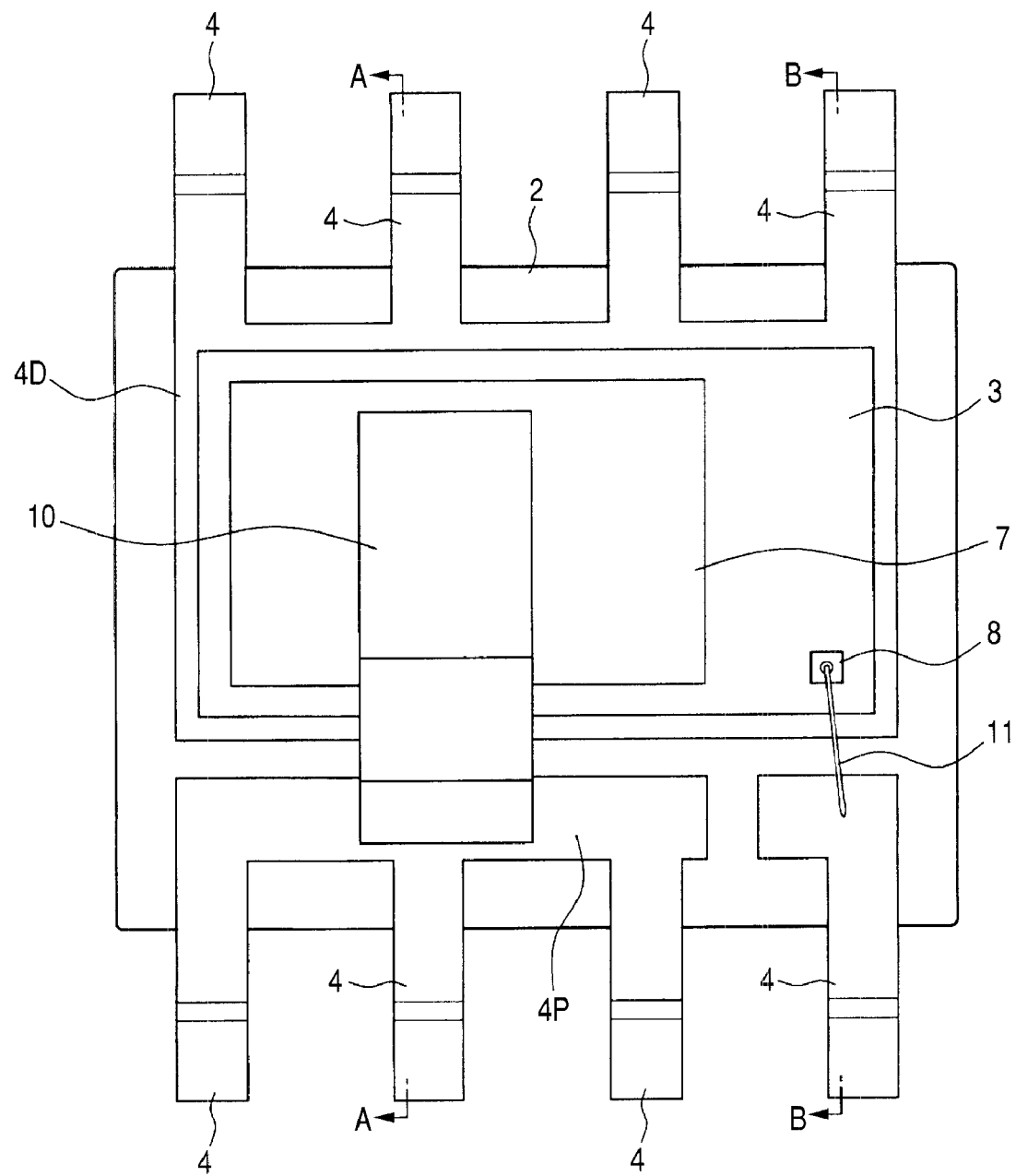
FIG. 3 is a plan view showing the internal structure of the semiconductor device which is the 1 embodiment of the present invention.

As shown in FIG. 3, the source pad (source electrode) 7 and the gate pad 8 are formed in the front surface of the silicon chip 3. The lead 4 (the No. 1 lead-the No. 3 lead) of three which constitutes a source lead is connected inside the mold resin 2. This connected portion (it is hereafter called the source post 4P) and the source pad 7 are electrically connected by the Al ribbon 10. The Al ribbon 10 comprises Al foil of about 1 mm wide and about 0.1 mm thick. On the other hand, the lead 4 (the No. 4 lead) of one which constitutes a gate lead, and the gate pad 8 are electrically connected by one Au wire 11. The source pad 7 and the gate pad 8 are constituted by the conducting film which was formed in the top layer of the silicon chip 3 and which makes an Al film a main body as is mentioned later. The source pad 7 comprises an area wider than the gate pad 8, in order to reduce the on resistance of power MOSFET.

The back surface of the silicon chip 3 constitutes the drain of power MOSFET, and is joined to the upper surface of the die pad part 4D via Ag paste 5. In order to reduce the on resistance of power MOSFET, as for the back surface of the silicon chip 3, the whole surface constitutes the drain of power MOSFET.

Figure 6:
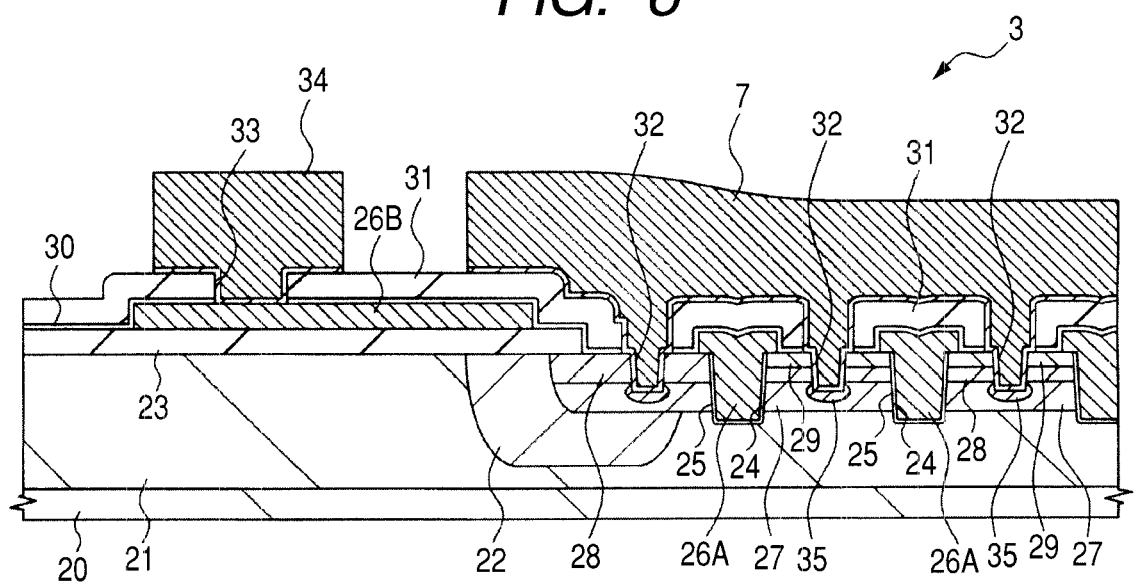
FIG. 6 is a principal part cross-sectional view showing power MOSFET formed in the silicon chip.

FIG. 6 is a principal part cross-sectional view showing trench gate type n channel power MOSFET formed in the above-mentioned silicon chip 3. n⁻type single crystal silicon layer 21 is formed in the main surface of n⁺ type single crystal silicon substrate 20 by the epitaxial grown method. n⁺ type single crystal silicon substrate 20 and n⁻type single crystal silicon layer 21 constitute the drain of power MOSFET.

The p type well 22 is formed in a part of n⁻type single crystal silicon layer 21. The silicon oxide film 23 is formed in a part of front surface of n⁻type single crystal silicon layer 21, and a plurality of trenches 24 are formed in other parts. The region covered with the silicon oxide film 23 among the front surfaces of n⁻type single crystal silicon layer 21 constitutes an isolation region, and the region in which the trench 24 was formed constitutes the element formation region (active region). Although illustration is not done, the plane forms of the trench 24 are polygons, such as a quadrangle, a hexagon, and an octagon, or a stripe extending to one way.

The silicon oxide film 25 which constitutes the gate oxide film of power MOSFET is formed in the bottom and side wall of the trench 24. In the inside of the trench 24, the polycrystalline silicon film 26A which constitutes the gate electrode of power MOSFET is embedded. On the other hand, the gate drawing electrode 26B which consists of a polycrystalline silicon film deposited at the same step as the polycrystalline silicon film 26A which constitutes the above-mentioned gate electrode is formed in the upper part of the silicon oxide film 23. The gate electrode (polycrystalline silicon film 26A) and the gate drawing electrode 26B are electrically connected in the region which is not illustrated.

The p⁻type semiconductor region 27 shallower than the trench 24 is formed in n⁻type single crystal silicon layer 21 of an element formation region. This p⁻type semiconductor region 27 constitutes the channel layer of power MOSFET. The p type semiconductor region 28 where impurity concentration is higher than the p⁻type semiconductor region 27 is formed in the upper part of the p⁻type semiconductor region 27, and the n⁺ type semiconductor region 29 is further formed in the upper part of the p type semiconductor region 28. The p type semiconductor region 28 constitutes the punch through stopper layer of power MOSFET, and the n⁺ type semiconductor region 29 constitutes the source.

The two-layer silicon oxide films 30 and 31 are formed in the upper part of the element formation region in which above-mentioned power MOSFET was formed, and the upper part of the isolation region in which the gate drawing electrode 26B was formed. The connection hole 32 which penetrates the silicon oxide films 31 and 30, the p type semiconductor region 28, and the n⁺ type semiconductor region 29, and reaches the p⁻type semiconductor region 27 is formed in the element formation region. The connection hole 33 which penetrates the silicon oxide films 31 and 30 and reaches the gate drawing electrode 26B is formed in the isolation region.

The source pad 7 and the gate wiring 34 which consist of a laminated film of a thin TiW (titanium tungsten) film and a thick Al film are formed in the upper part of the silicon oxide film 31 including the inside of the connection holes 32 and 33. The source pad 7 formed in the element formation region is electrically connected to the source (n⁺ type semiconductor region 29) of power MOSFET through the connection hole 32. The p⁺ type semiconductor region 35 for doing ohmic contact of the source pad 7 and the p⁻type semiconductor region 27 is formed in the bottom of this connection hole 32. The gate wiring 34 formed in the isolation region is connected to the gate electrode (polycrystalline silicon film 26A) of power MOSFET via the gate drawing electrode 26B of the lower part of the connection hole 33.

The end of the Al ribbon 10 is electrically connected to the source pad 7 by the wedge-bonding method. As for the source pad 7, when doing bonding of the Al ribbon 10, in order to ease the impact power MOSFET is shocked, it is desirable to make thickness in the upper part of the silicon oxide films 32 and 33 more than 3 μm.

Figure 7:
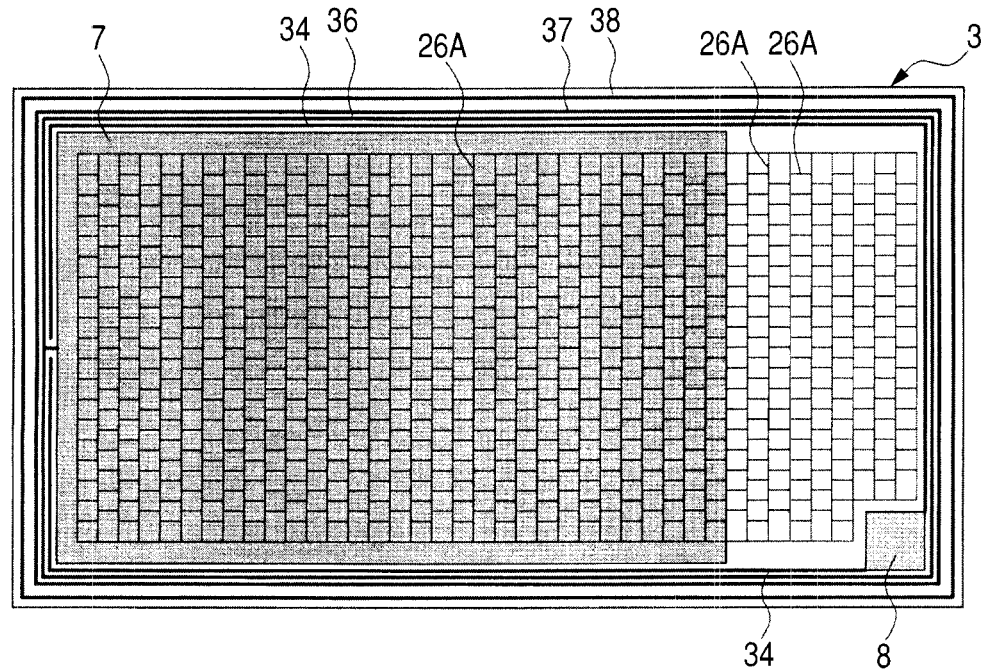
FIG. 7 is a plan view showing the conducting film of the top layer including a source pad, a gate pad, and gate wiring and the lower layer gate electrode which were formed in the silicon chip.

FIG. 7 is a plan view showing the conducting film of the top layer including the source pad 7, the gate pad 8, and the gate wiring 34 and the lower layer gate electrode (polycrystalline silicon film 26A) which were formed in the silicon chip 3. The gate wiring 34 is electrically connected to the gate pad 8, and the source pad 7 is electrically connected to Al wiring 36. Al wiring 37 and 38 is formed in the outer peripheral part of the silicon chip 3. The gate pad 8 and Al wiring 36, 37, and 38 comprise a conducting film (laminated film of a TiW film and an Al film) of the same layer as the source pad 7 and the gate wiring 34. As for the actual silicon chip 3, since the gate wiring 34 and Al wiring 36, 37, and 38 are covered with the surface protection film which is not illustrated, only the source pad 7 and the gate pad 8 have exposed to the front surface of the silicon chip 3 among the above-mentioned conducting films of the top layer. In the example shown in FIG. 7, since the plane form of the trench 24 in which a gate electrode (polycrystalline silicon film 26A) is formed was made into the quadrangle, the plane form of the gate electrode (polycrystalline silicon film 26A) also constitutes a quadrangle.

Figure 8:
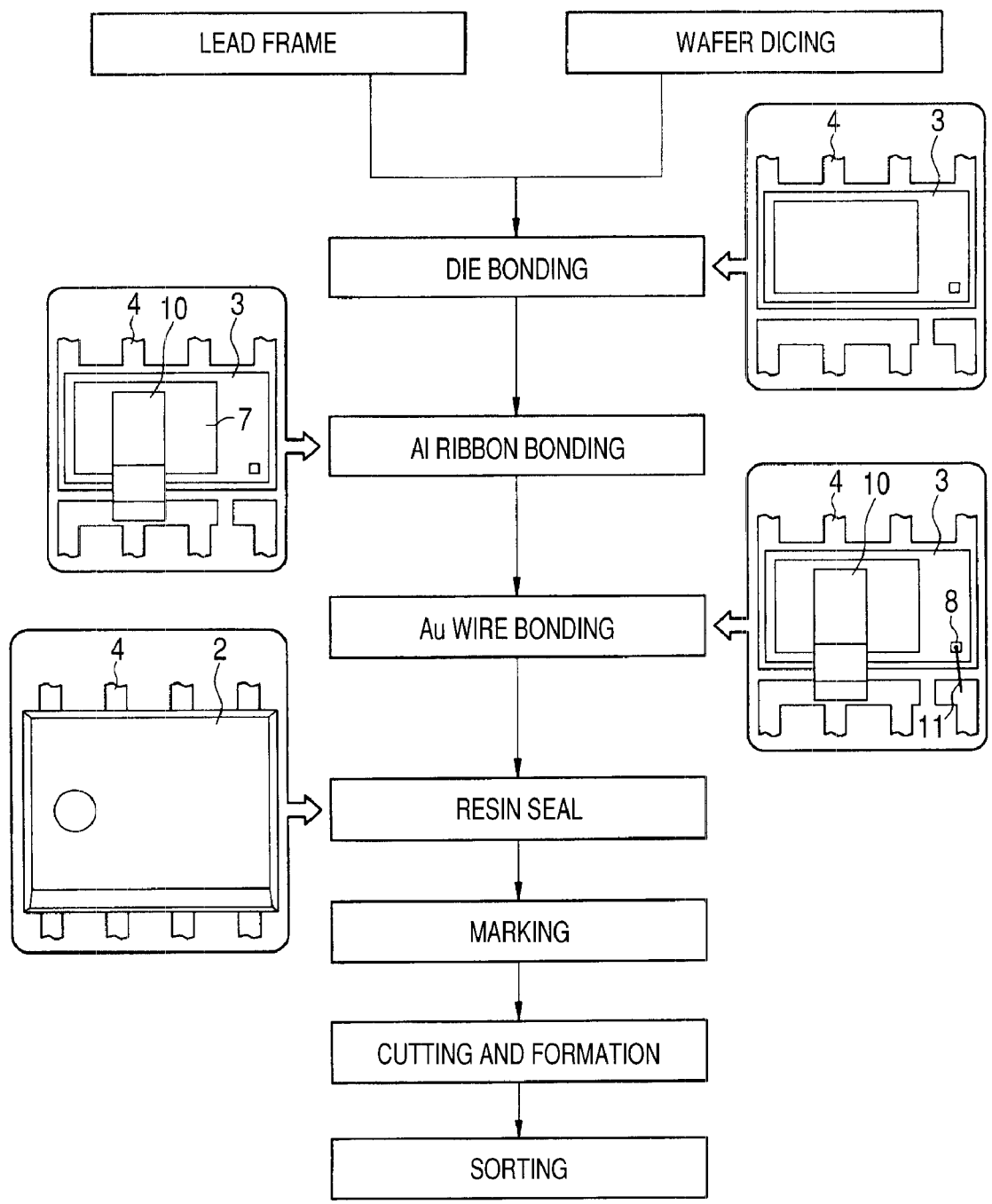
FIG. 8 is a flow diagram showing the manufacturing process of the semiconductor device which is the 1 embodiment of the present invention.

Next, the manufacturing method of SOP8 of this embodiment is explained. FIG. 8 is a flow diagram showing the manufacturing process of SOP8. First, in order to manufacture SOP8, after forming power MOSFET (refer to FIG. 6) in a silicon wafer using well-known art, dicing of this silicon wafer is done and the silicon chip 3 is obtained. The lead frame in which the lead 4, the die pad part 4D, and the source post 4P were formed is prepared. The lead frame consists of a Cu or Fe—Ni alloy. In order to improve adhesive strength with the Al ribbon 10 and Au wire 11, the plated layer of the three-layer structure (nickel/Pd/Au) which stacked the Ni film and the Au film to the upper and lower sides of Pd film is formed in the front surface, for example.

Figure 9:
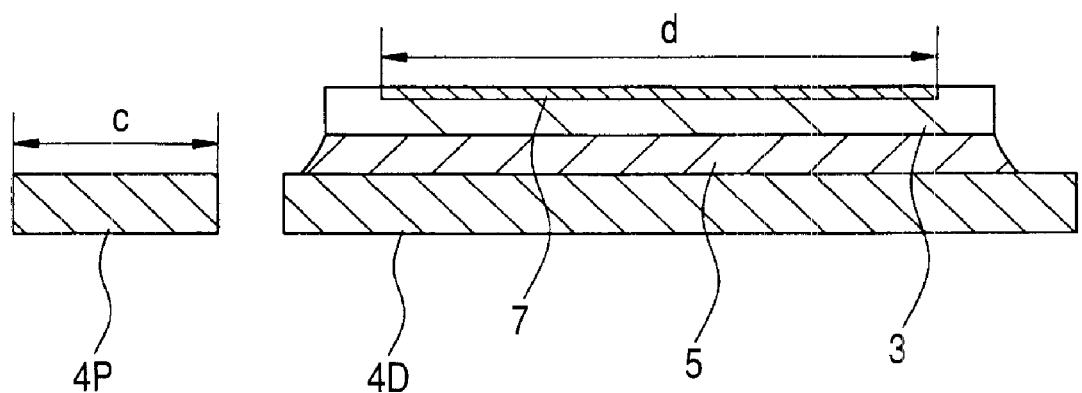
FIG. 9 is a principal part cross-sectional view showing the manufacturing method of the semiconductor device which is the 1 embodiment of the present invention.

Next, as shown in FIG. 9, the silicon chip 3 is mounted on the die pad part 4D of the lead frame using Ag paste 5 (die bonding). When doing wedge bonding of the Al ribbon 10 to the front surface of the silicon chip 3 as it may mention later, big ultrasonic vibration energy is applied not only to the front surface of the silicon chip 3 but to Ag paste 5 which intervenes between the silicon chip 3 and the die pad part 4D. Therefore, in order to prevent originating in this ultrasonic vibration energy and a crack occurring in Ag paste 5, it is desirable to use selectively Ag paste 5 with the optimal elastic modulus (Pa). The reference c of FIG. 9 shows the width of the source post 4P formed in the lead frame, and the reference d shows the width of the source pad 7 along the width direction of the source post 4P.

Next, bonding of the Al ribbon 10 is done to the source pad 7 of the silicon chip 3, and the source post 4P of the lead frame by the following methods.

FIG. 10A is a side view showing the neighborhood of a point of the wedge tool with which the wedge bonder used for the bonding of the Al ribbon 10 was equipped, and FIG. 10B is the plan view which observed the point of the wedge tool from the lower part.

As shown in FIG. 10A, the ribbon guide 14 is attached to one side surface of the wedge tool 12, and the Al ribbon 10 passing through the inside of this ribbon guide 14 is sent out to the point of the wedge tool 12. The cutter 15 which cuts the Al ribbon 10 sent out to the point of the wedge tool 12 is attached to another side surface of the wedge tool 12 so that up-and-down motion is possible.

The point of the wedge tool 12 has branched to two by V-groove 13. When equipping a wedge bonder with the wedge tool 12, it equips so that the extending direction of this V-groove 13 may intersect perpendicularly to the width (c) direction of the source post 4P shown in FIG. 9.

As shown in FIG. 10B, the bottom of the wedge tool 12 sandwiches the above-mentioned V-groove 13, and is divided into two at the first branch 12A and the second branch 12B in which each has a rectangular plane form. Here, the bottom of the wedge tool 12 is formed so that the width (e) of the direction which intersects perpendicularly with the extending direction of V-groove 13 may be the same as that (d) of the source pad 7 shown in FIG. 9 or may become narrow slightly from this width (d). The width (a) of the first branch 12A in this width (d) direction is formed so that it may become narrower than the width (c) of the source post 4P shown in FIG. 9. Although the width (b) of the second branch 12B is suitably changed according to the size of the silicon chip 3, i.e., the width of the source pad 7, (d), let it be a thing wider than the width (a) of the first branch 12A here.

Bonding of the Al ribbon 10 is done to the source pad 7 and the source post 4P using the above-mentioned wedge tool 12.

Figure 11:
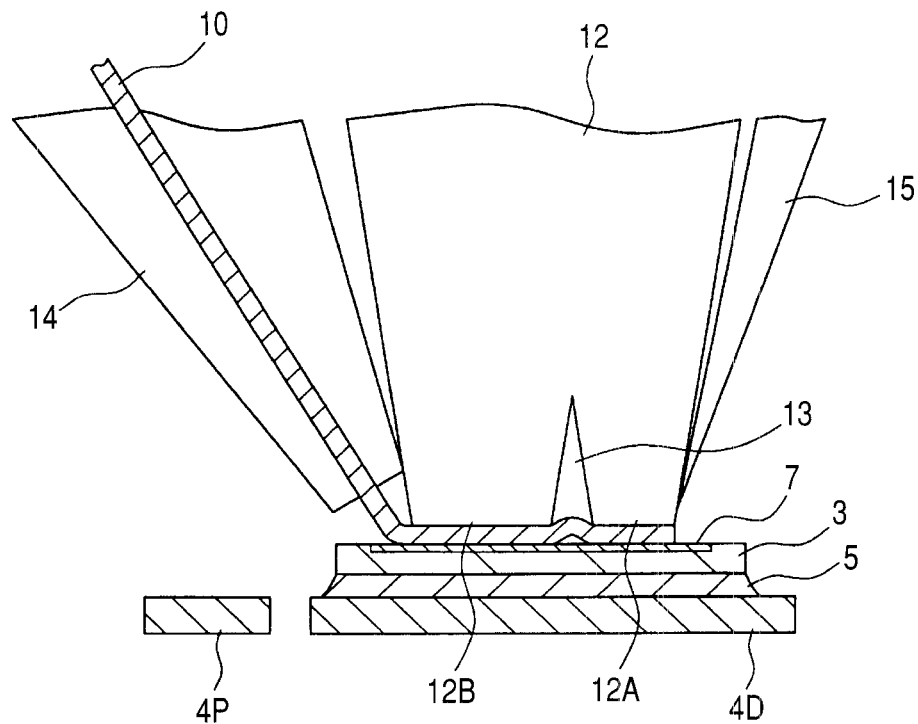
FIG. 11 is a principal part cross-sectional view showing the manufacturing method of the semiconductor device following FIG. 9.

First, as shown in FIG. 11, the point of the Al ribbon 10 sent out from the ribbon guide 14 is positioned on the source pad 7 of the silicon chip 3. Then, the first branch 12A and the second branch 12B of the wedge tool 12 are simultaneously contacted by pressure to the Al ribbon 10, and the supersonic vibration of the energy of about several W is applied. Hereby, the Al ribbon 10 of the region which is in contact with the first branch 12A and the second branch 12B is joined to the front surface of the source pad 7. The Al ribbon 10 of the lower part of V-groove 13 does not contact the bottom of the wedge tool 12, but loses slightly (about 8 μm~25 μm) touch with the front surface of the source pad 7.

Figure 12:
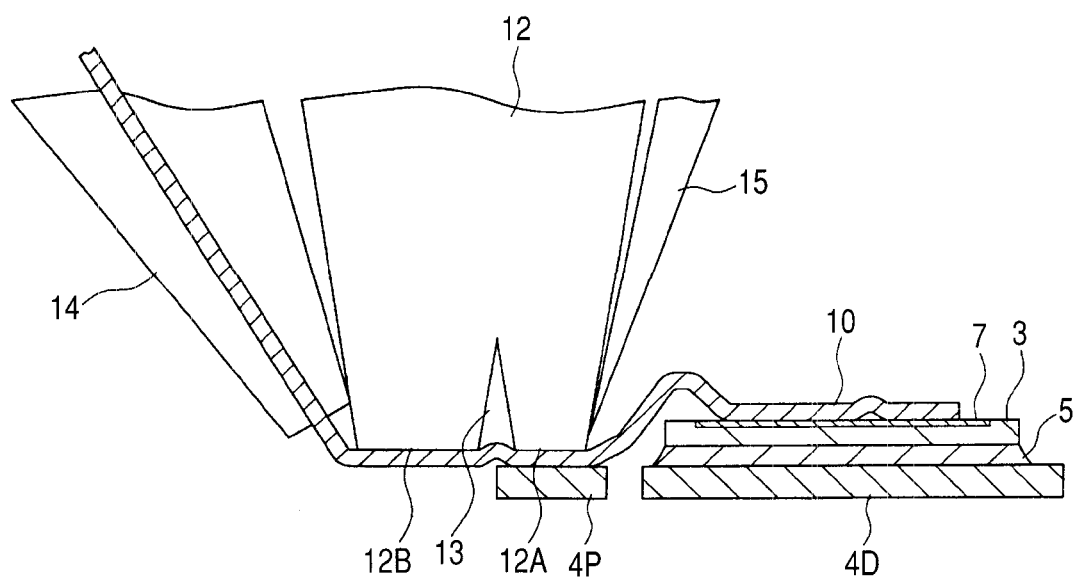
FIG. 12 is a principal part cross-sectional view showing the manufacturing method of the semiconductor device following FIG. 11.

Next, as shown in FIG. 12, the wedge tool 12 is moved and the center of the width (a) of the first branch 12A is positioned at the center of the width (c) of the source post 4P. Then, the first branch 12A is contacted by pressure to the Al ribbon 10 on the source post 4P, and the supersonic vibration of the energy of about several W is applied. Hereby, the Al ribbon 10 of the region which is in contact with the first branch 12A is joined to the front surface of the source post 4P. However, since the width (a) of the first branch 12A is narrower than the width (c) of the source post 4P, the Al ribbon 10 is not joined by the end surface of the width (c) direction of the source post 4P.

Next, as shown in FIG. 13, on the end portion of the source post 4P, the cutter 15 is positioned and is descended. The Al ribbon 10 of a region which is not joined to the source post 4P is cut by this, and bonding of the Al ribbon 10 is done to the source pad 7 and the source post 4P, respectively.

Next, although illustration is omitted, bonding of Au wire 11 is done to the gate pad 8 of the silicon chip 3, and the lead 4 (the No. 4 lead which constitutes a gate lead) by the ball-bonding method of common knowledge using heat and an ultrasonic wave, respectively. Then, the silicon chip 3 (and the die pad part 4D, the source post 4P, the Al ribbon 10, Au wire 11, the inner lead part of the lead 4) is sealed with the mold resin 2 using a metal mold. Then, marking of a product name, the manufacturing number, etc. is done to the front surface of the mold resin 2. Next, the unwanted part of the lead 4 exposed to the outside of the mold resin 2 is cut and removed, and the outer lead portion of the lead 4 is formed in the shape of a gull wing. Then, SOP8 of this embodiment shown in FIG. 1-FIG. 5 is completed by passing through the sorting process which distinguishes the good and the defect of a product.

Figure 14A:
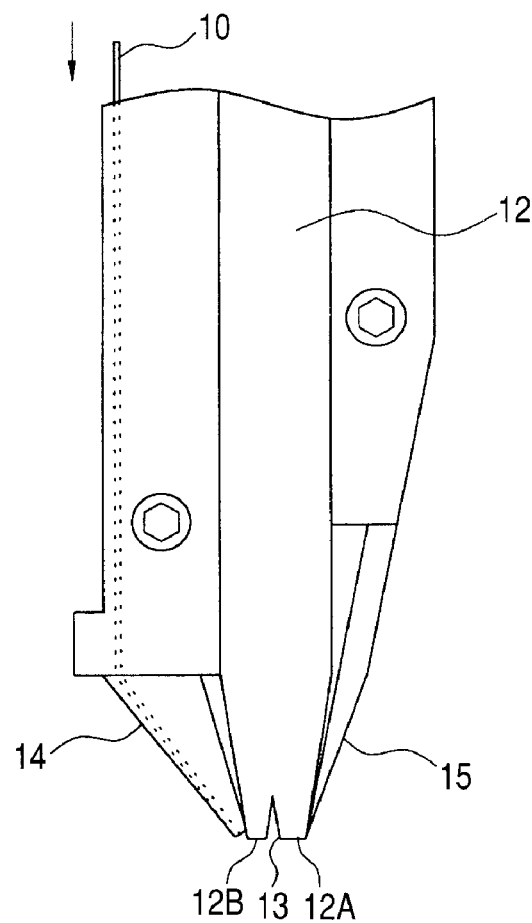
FIG. 14A is a side view showing the neighborhood of a point of the wedge tool used in other embodiment of the present invention.
Figure 14B:
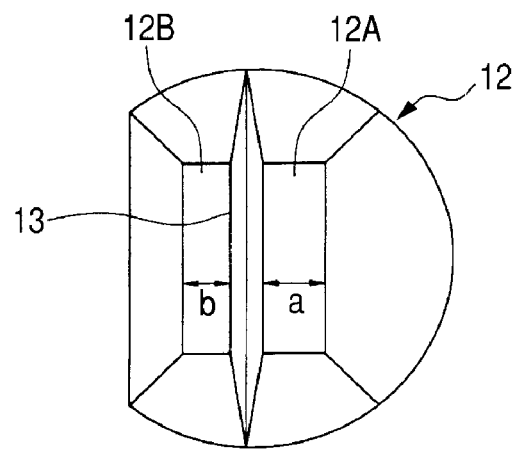
FIG. 14B is the plan view which observed the point of this wedge tool from the lower part.

Here, the wedge tool 12 whose width (b) of the second branch 12B is wider than the width (a) of the first branch 12A was used. However, when the width of the silicon chip 3, i.e., the width of the source pad 7, (d) is narrow, as shown in FIGS. 14A and 14B, the wedge tool 12 whose width (b) of the second branch 12B is narrower than the width (a) of the first branch 12A is used.

Figure 15:
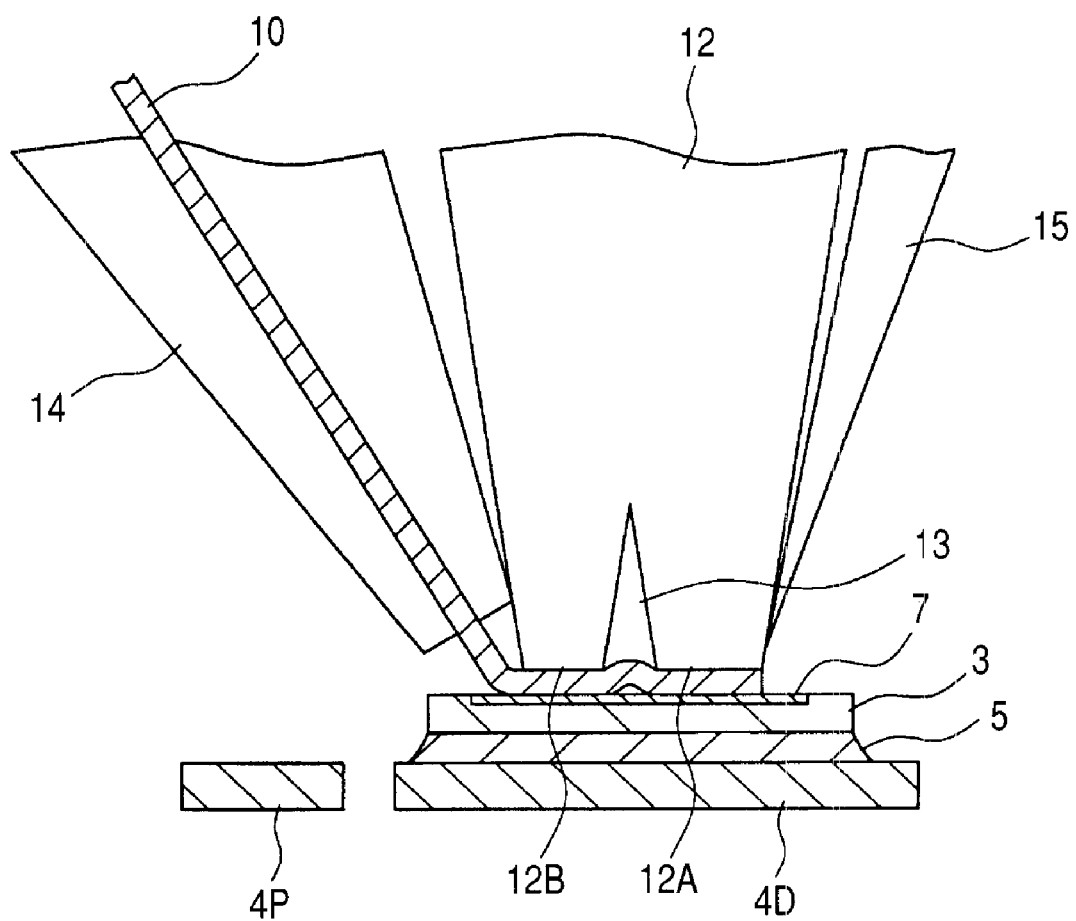
FIG. 15 is a principal part cross-sectional view showing the manufacturing method of the semiconductor device which is other embodiment of the present invention.
Figure 16:
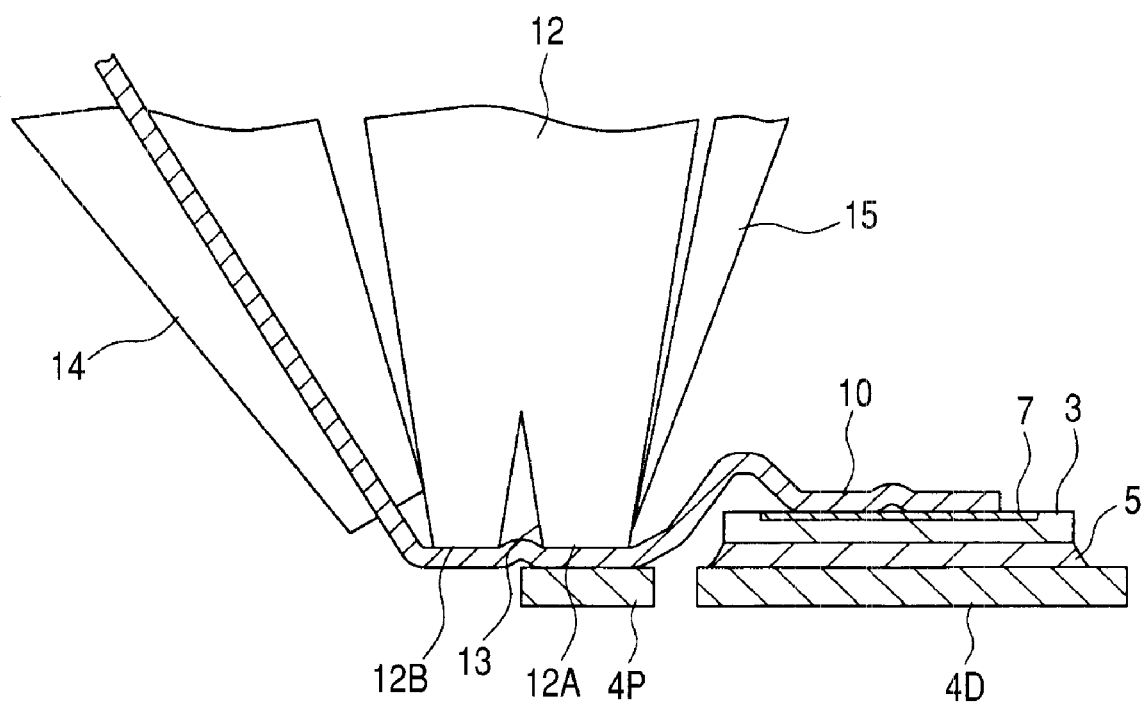
FIG. 16 is a principal part cross-sectional view showing the manufacturing method of the semiconductor device following FIG. 15.
Figure 17:
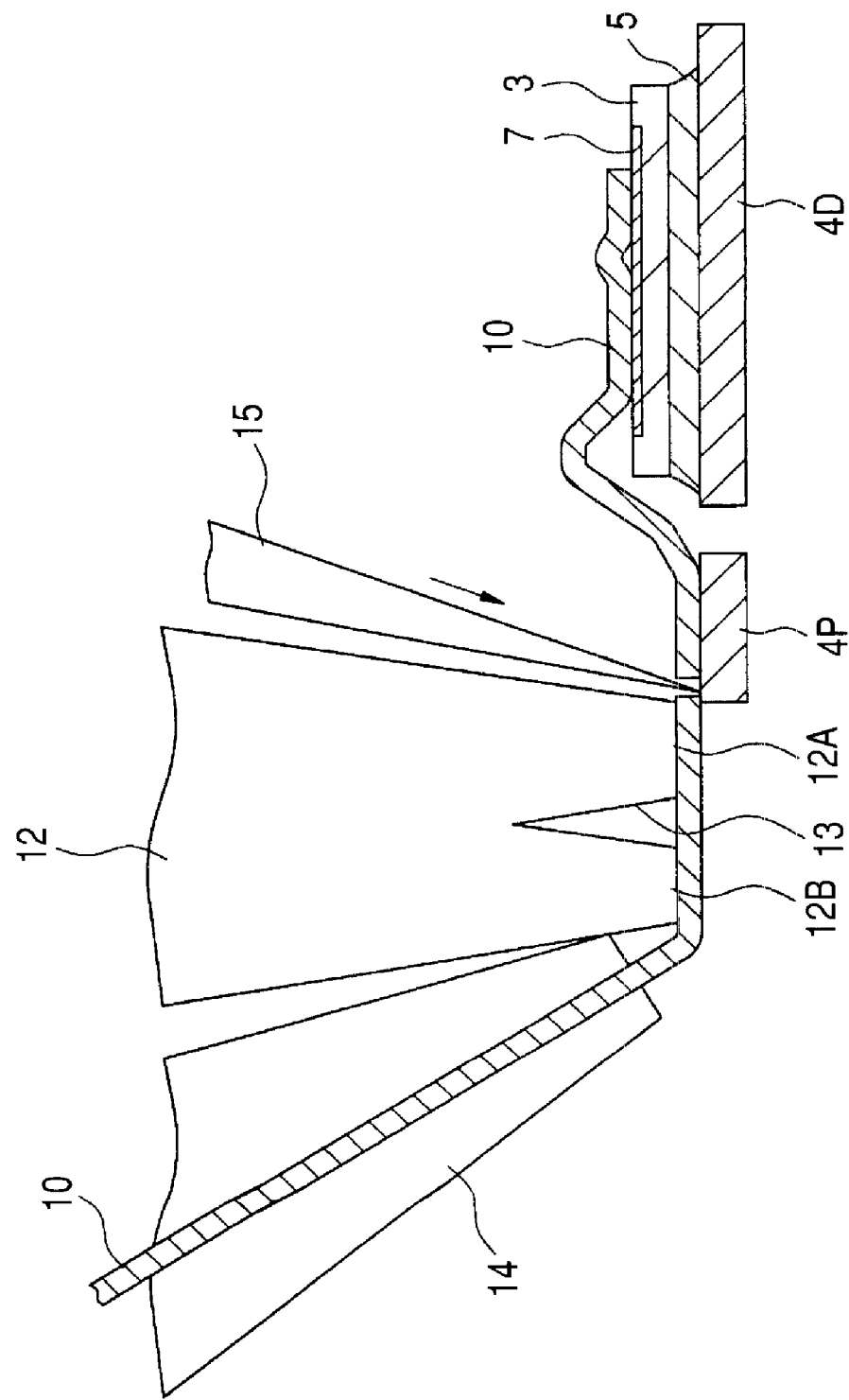
FIG. 17 is a principal part cross-sectional view showing the manufacturing method of the semiconductor device following FIG. 16.

Bonding of the Al ribbon 10 is done to the source pad 7 and the source post 4P using this wedge tool 12. First, as shown in FIG. 15, the Al ribbon 10 is joined to the front surface of the source pad 7 by contacting by pressure simultaneously the first branch 12A and the second branch 12B of the wedge tool 12 to the Al ribbon 10 on the source pad 7, and applying supersonic vibration. Next, as shown in FIG. 16, the Al ribbon 10 is joined to the front surface of the source post 4P by contacting the first branch 12A by pressure to the Al ribbon 10 on the source post 4P, and applying supersonic vibration to it. Next, as shown in FIG. 17, the cutter 15 cuts the end portion 10 of the source post 4P, i.e., Al ribbon of a region which is not joined to the source post 4P.

Thus, when doing bonding of the Al ribbon 10 to the source pad 7 and the source post 4P, the wedge tool 12 which has the bottom divided into the first branch 12A and the second branch 12B is used. Hereby, it becomes possible to join the Al ribbon 10 to the source pad 7 with 1 time of bonding, securing the junction area of the source pad 7 and the Al ribbon 10.

By this, the ultrasonic vibration energy applied to Ag paste 5 which intervenes between the silicon chip 3 and the die pad part 4D can be reduced compared with the conventional technology which joins the Al ribbon 10 to the source pad 7 with 2 times of bonding. Therefore, the crack generation of Ag paste 5 resulting from this ultrasonic vibration energy is suppressed, and the joining reliability of the silicon chip 3 and the die pad part 4D improves. Since the ultrasonic vibration energy applied to silicon chip 3 itself is also reduced, the damage applied to the silicon chip 3 is also reduced.

Bonding time can be shortened compared with the conventional technology which joins the Al ribbon 10 to the source pad 7 with 2 times of bonding. Therefore, the productivity of SOP8 can improve and the manufacturing cost can be reduced.

Embodiment 2

Figure 18:
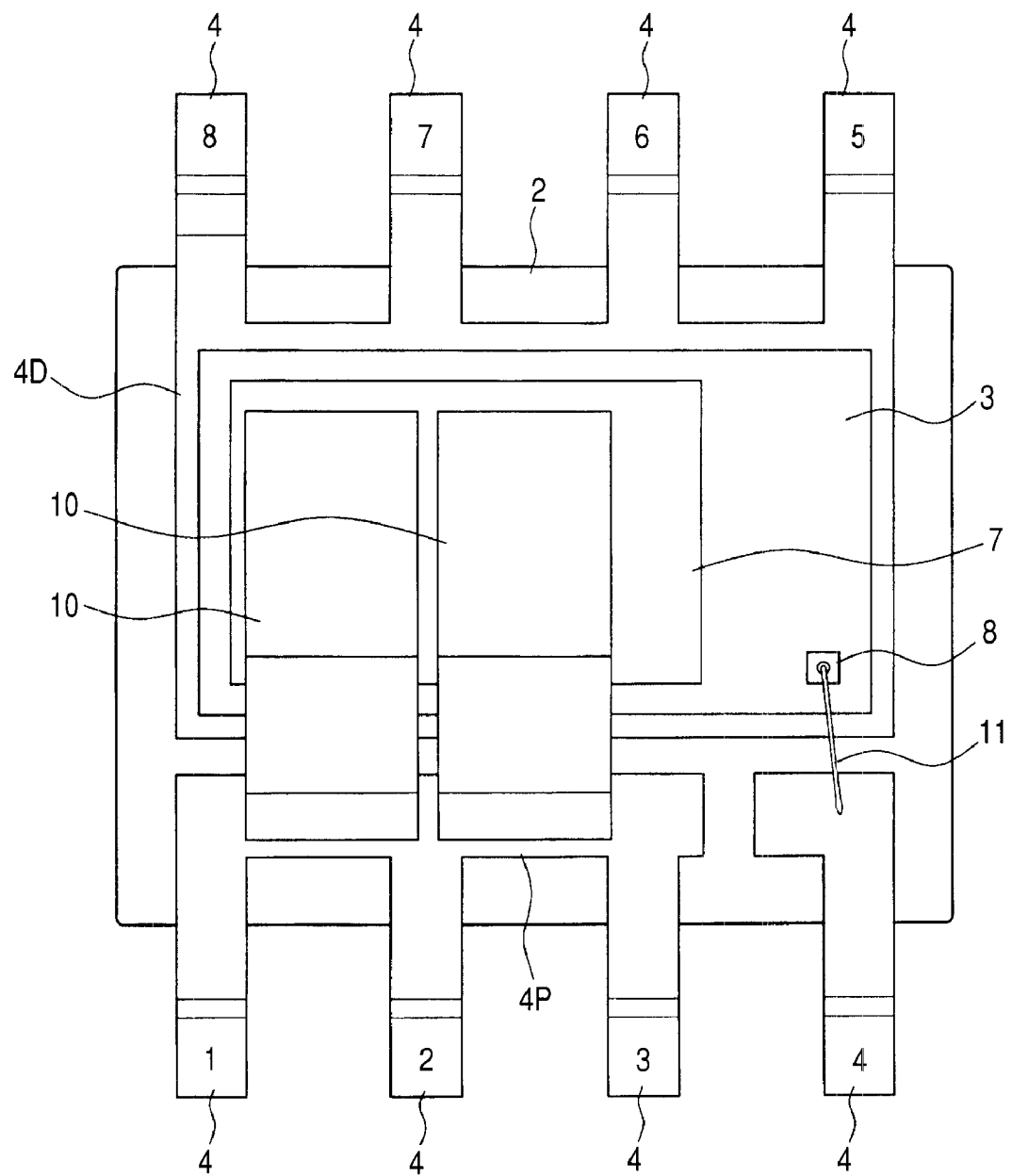
FIG. 18 is a plan view showing the internal structure of the semiconductor device which is other embodiment of the present invention.

FIG. 18 is a plan view showing the internal structure of SOP8 of this embodiment. There is the feature of this SOP8 in the source pad 7 being connected with the source post 4P by a plurality of Al ribbons 10. Although the number of the Al ribbon 10 may be three or more, the example connected by the two Al ribbons 10 is shown here.

By the kind or generation, SOP8 differs in the size of the silicon chip 3, and it differs also in the size of the source pad 7 in connection with this. Therefore, when two or more kinds of Al ribbons 10 in which width differs are prepared each time according to the size of the source pad 7, management of the Al ribbon 10 will become complicated. On the other hand, when preparing the Al ribbon 10 with comparatively narrow width of one kind and changing the connection number of the Al ribbon 10 according to the size of the source pad 7, management of the Al ribbon 10 will not become complicated.

Thus, the junction area of the source pad 7 and the Al ribbon 10 becomes large by connecting the source pad 7 with the source post 4P by a plurality of Al ribbons 10. Therefore, source resistance can be made smaller. Bonding time can be shortened in this case by doing bonding of a plurality of Al ribbons 10 simultaneously with the one bonding tool 12.

Figure 19:
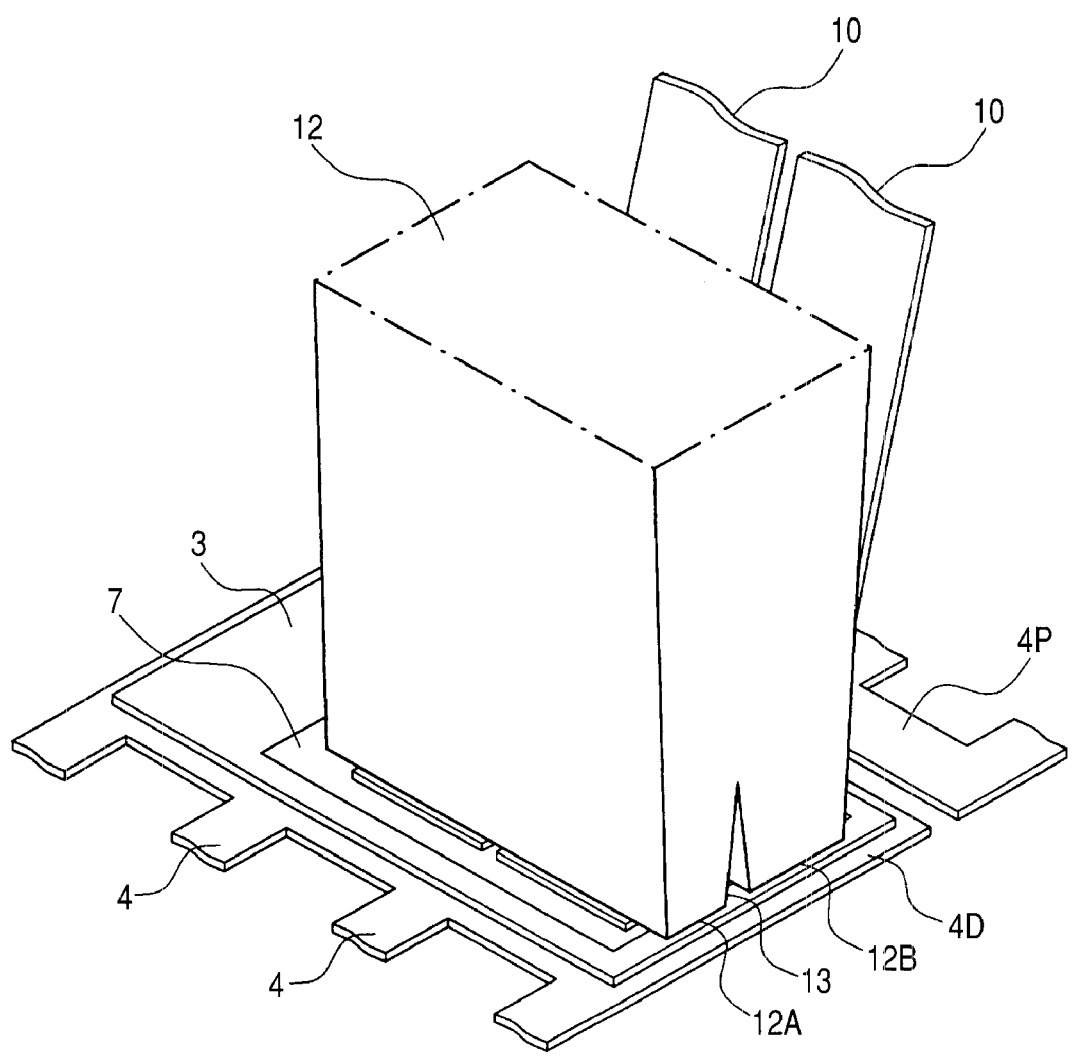
FIG. 19 is a principal part perspective view showing the manufacturing method of the semiconductor device which is other embodiment of the present invention.
Figure 20:
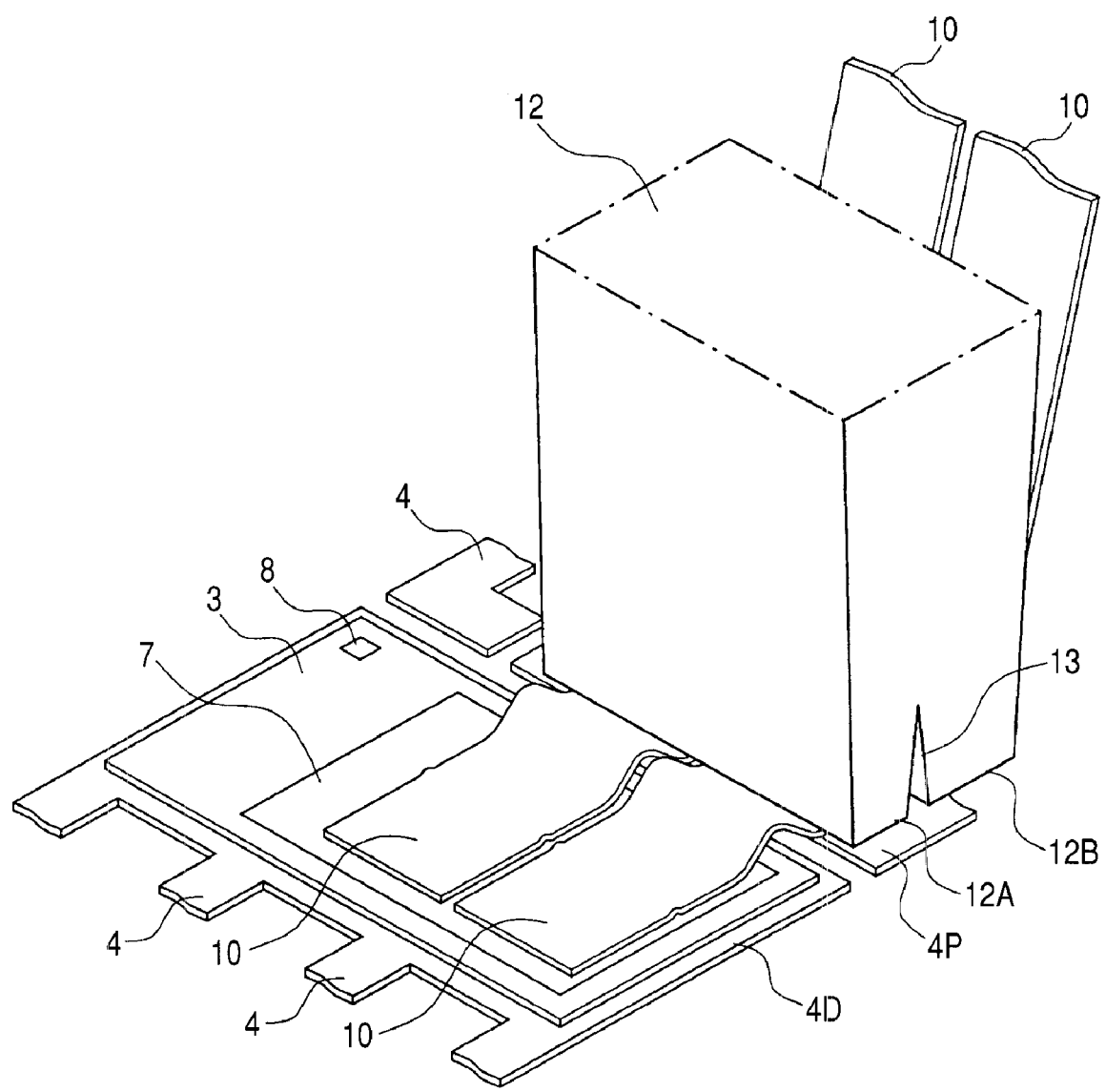
FIG. 20 is a principal part perspective view showing the manufacturing method of the semiconductor device following FIG. 19.

The wedge tool 12 which has the bottom divided into the first branch 12A and the second branch 12B on both sides of V-groove 13 is prepared like the Embodiment 1 also in this case. And first, as shown in FIG. 19, the first branch 12A and the second branch 12B of the wedge tool 12 are simultaneously contacted by pressure to the Al ribbon 10, and ultrasonic vibration energy is applied. And bonding of the two Al ribbons 10 is simultaneously done to the front surface of the source pad 7. Next, as shown in FIG. 20, the first branch 12A of the wedge tool 12 is contacted by pressure to the Al ribbon 10, ultrasonic vibration energy is applied, and bonding of the two Al ribbons 10 is simultaneously done to the front surface of the source post 4P. Hereby, the same effect as the Embodiment 1 can be acquired. In FIG. 19 and FIG. 20, illustration of the ribbon guide 14 and the cutter 15 is omitted.

Embodiment 3

Figure 21:
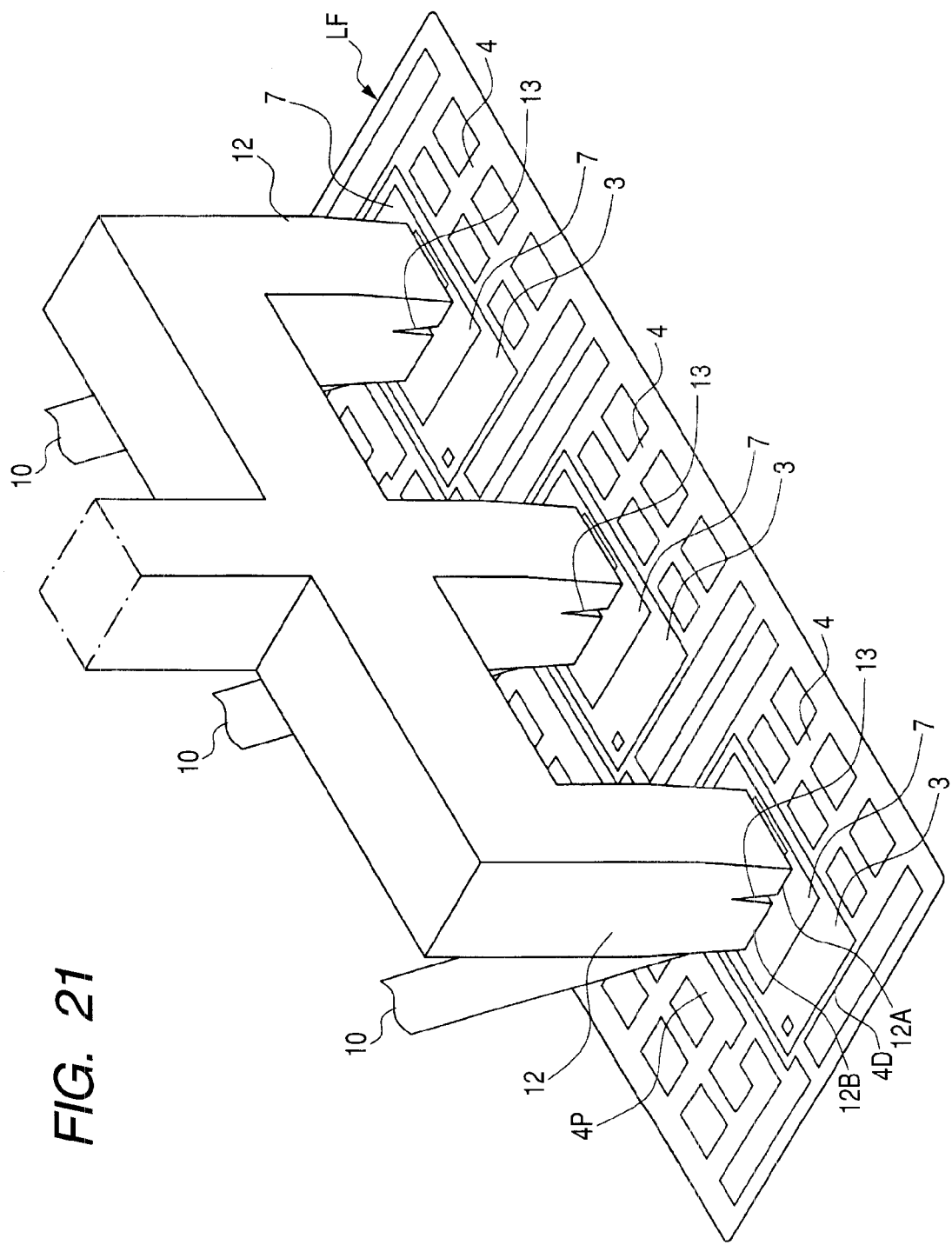
FIG. 21 is a principal part perspective view showing the manufacturing method of the semiconductor device which is other embodiment of the present invention.

Generally, in the manufacturing process of a resin molded type semiconductor device like SOP8, the lead frame which formed a plurality of die pad parts 4D as shown in FIG. 21 is used. Here, lead frame LF which formed the three die pad parts 4D is shown.

When connecting the source post 4P with the source pad 7 of the three silicon chips 3 mounted in such lead frame LF by the Al ribbon 10, as shown in FIG. 21, the three wedge tools 12 are connected. Bonding time can be shortened by connecting the Al ribbon 10 to the source pad 7 of the three silicon chips 3 simultaneously. In FIG. 21, illustration of the ribbon guide 14 and the cutter 15 is omitted.

Also in this case, the wedge tool 12 which has the bottom divided into the first branch 12A and the second branch 12B on both sides of V-groove 13 is used like the Embodiment 1. Hereby, since the Al ribbon 10 is joinable to each source pad 7 of the three silicon chips 3 with 1 time of bonding, the same effect as the Embodiment 1 can be acquired.

Figure 22:
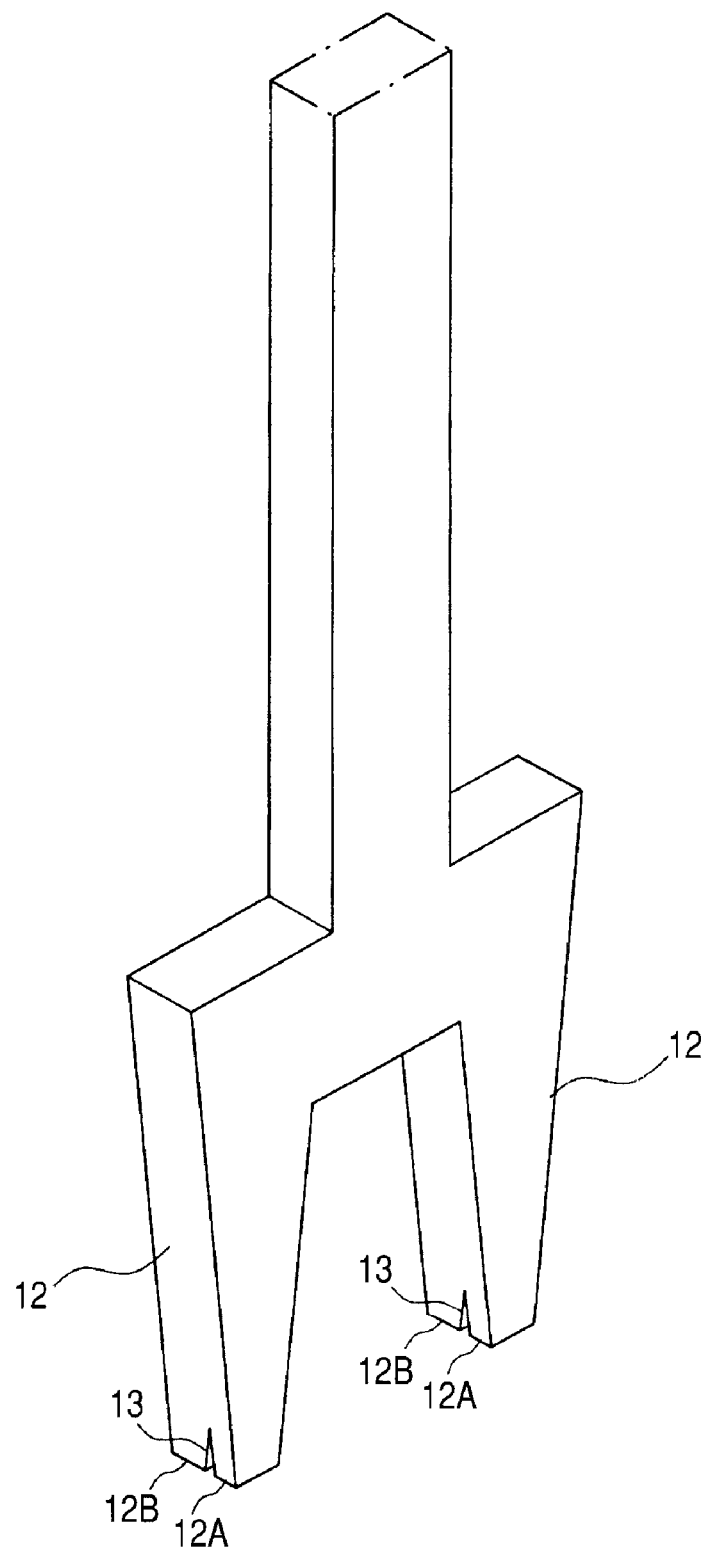
FIGS. 22 and 23 are perspective views of the wedge tool used in other embodiment of the present invention.
Figure 23:
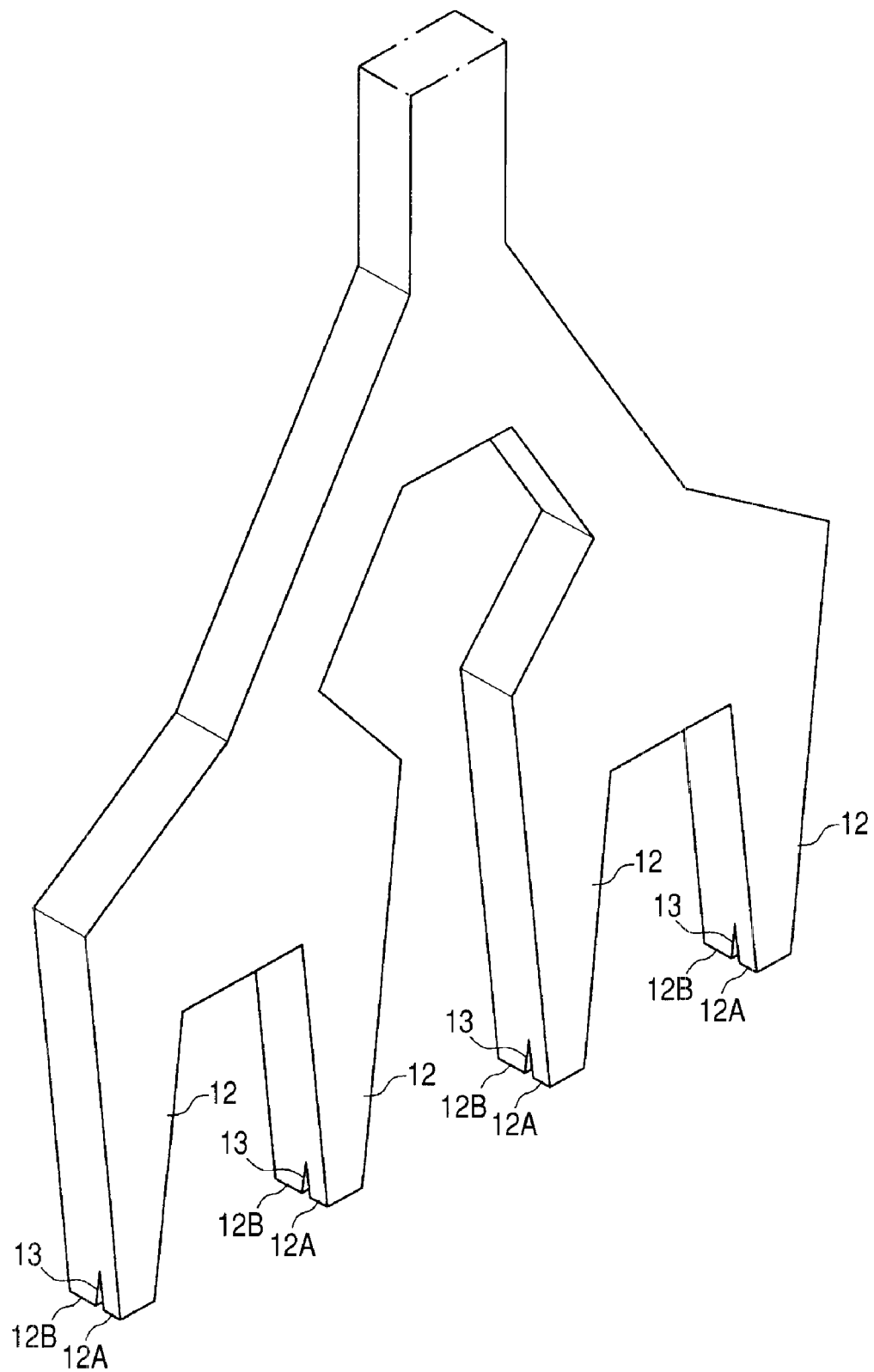

FIG. 22 is a perspective view showing an example of the wedge tool 12 which connects the Al ribbon 10 to the two source pads 7 simultaneously. FIG. 23 is a perspective view showing an example of the wedge tool 12 which connects the Al ribbon 10 to the four source pads 7 simultaneously. The bottom is divided into the first branch 12A and the second branch 12B also when using these wedge tools 12. Hereby, since the Al ribbon 10 is joinable to each source pad 7 of a plurality of silicon chips 3 with 1 time of bonding, the same effect as the Embodiment 1 can be acquired.

Embodiment 4

FIG. 24A is a side view showing the neighborhood of a point of the wedge tool of this embodiment, and FIG. 24B is the plan view which observed the point of this wedge tool from the lower part.

Figure 25:
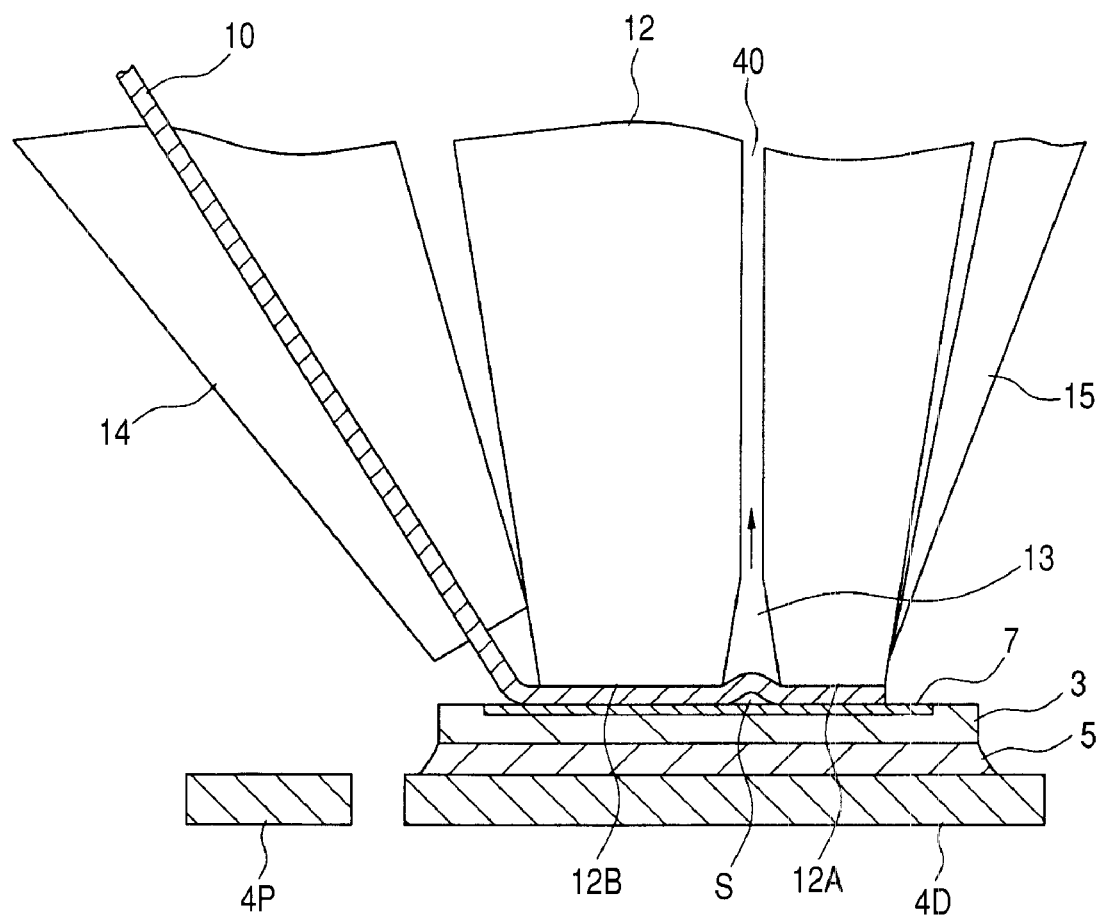
FIG. 25 is a principal part cross-sectional view showing the manufacturing method of the semiconductor device which is other embodiment of the present invention.

The vacuum hole 40 for decompressing the inside of V-groove 13 is formed in this wedge tool 12. Therefore, as shown in FIG. 25, when joining the Al ribbon 10 to the source pad 7 using this wedge tool 12 and the inside of V-groove 13 is decompressed, vacuum suction of the Al ribbon 10 of the lower part of V-groove 13 will be done to the internal direction of V-groove 13, and space (S) will generate between the source pads 7.

As mentioned above, when the bottom of the wedge tool 12 is divided into two by V-groove 13, the Al ribbon 10 of the lower part of V-groove 13 does not contact the bottom of the wedge tool 12, but loses slightly (about 8 μm~25 μm) touch with the front surface of the source pad 7. Therefore, when this quantity of floating is small and the silicon chip 3 is sealed with the mold resin 2, the mold resin 2 cannot be entered between the Al ribbon 10 and the source pad 7, but few cavities (void) may generate.

On the other hand, since the mold resin 2 enters the inside of this space (S) surely when space (S) is formed between the Al ribbon 10 and the source pad 7 of the lower part of V-groove 13, it can prevent a cavity (void) generating between the Al ribbon 10 and the source pad 7.

In the foregoing, the present invention accomplished by the present inventors is concretely explained based on above embodiments, but the present invention is not limited by the above embodiments, but variations and modifications may be made, of course, in various ways in the limit that does not deviate from the gist of the invention.

According to the embodiment, the Al ribbon 10 was used as a conductive material which connects the source post 4P with the source pad 7. However, also when using the ribbon which comprised other metallic materials with small electric resistance like Au or a Cu alloy, it can apply. Materials other than Au wire 11, for example, an Al wire, may be used as a conductive material which connects the gate pad 8 with the lead (gate lead) 4.

Figure 26:
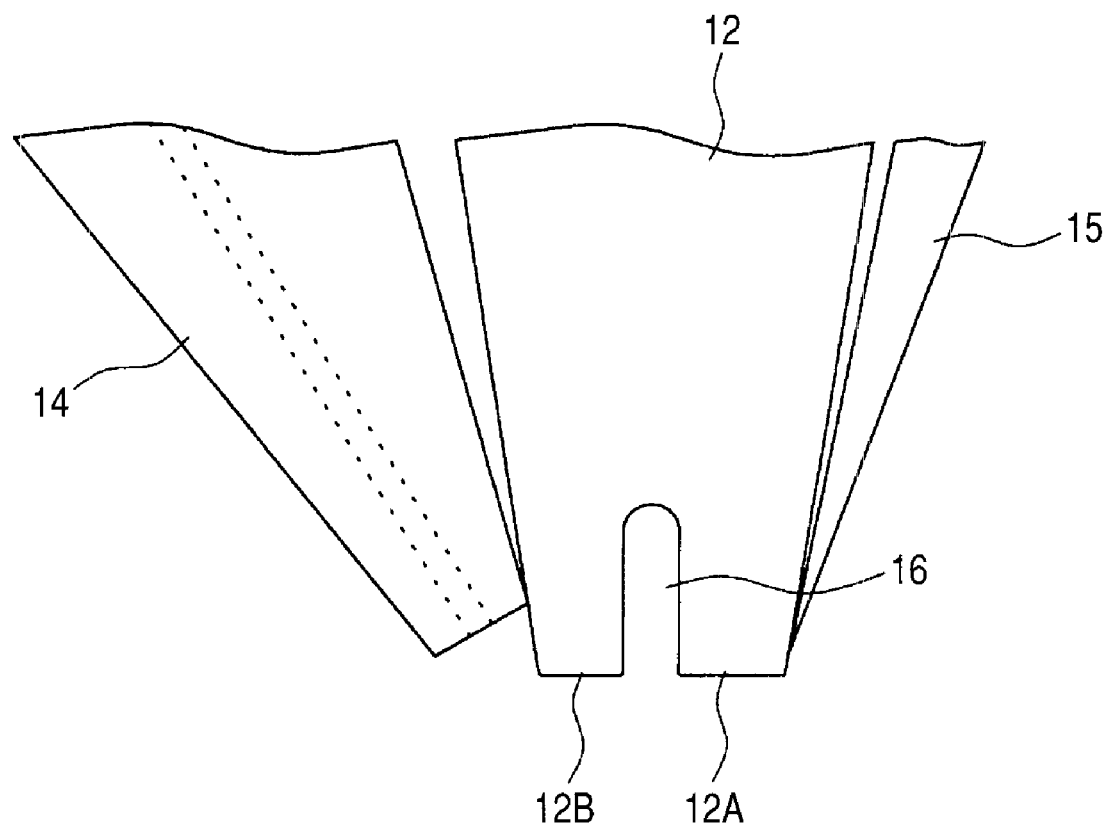
FIGS. 26 and 27 are side views showing the neighborhood of a point of the wedge tool used in other embodiment of the present invention.
Figure 27:
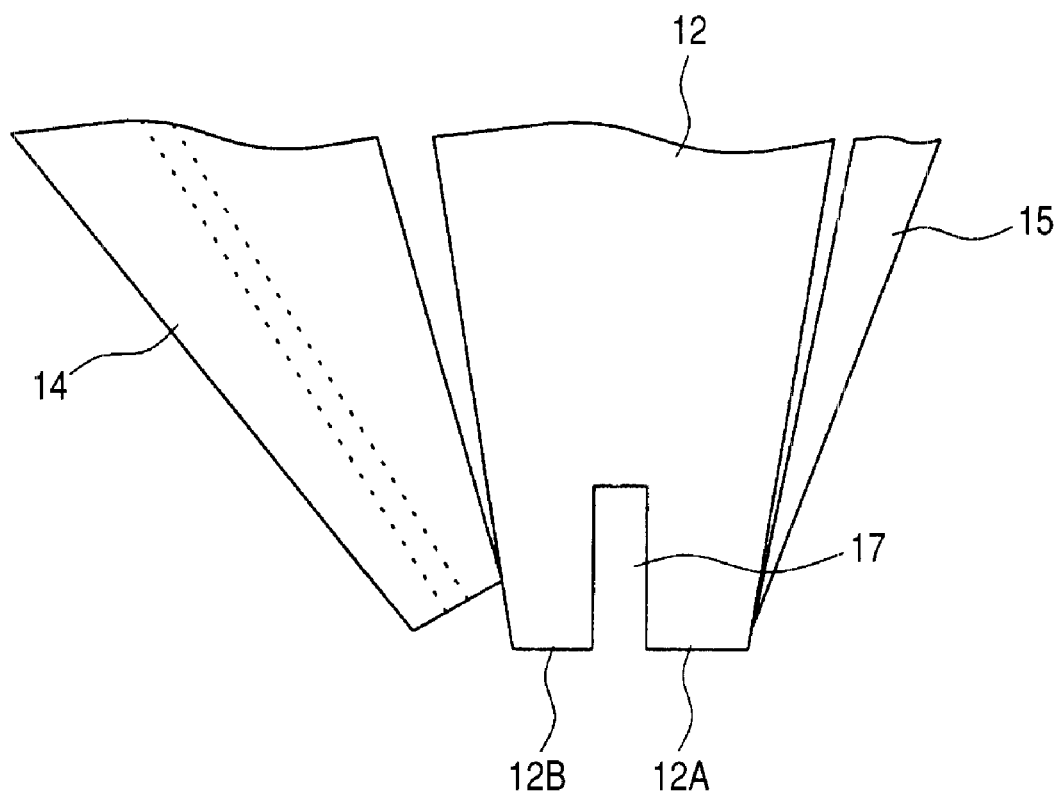
Figure 28B:
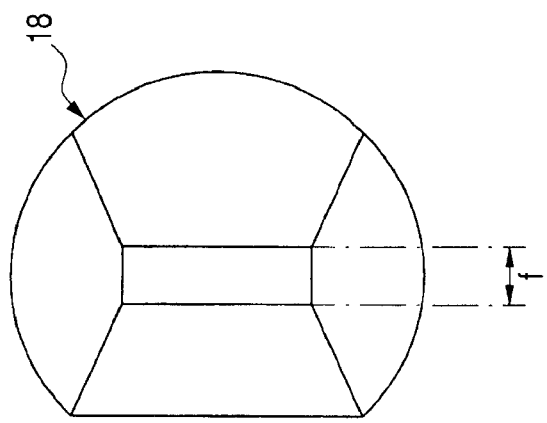
FIG. 28B is the plan view which observed the point of this wedge tool from the lower part.
Figure 28A:
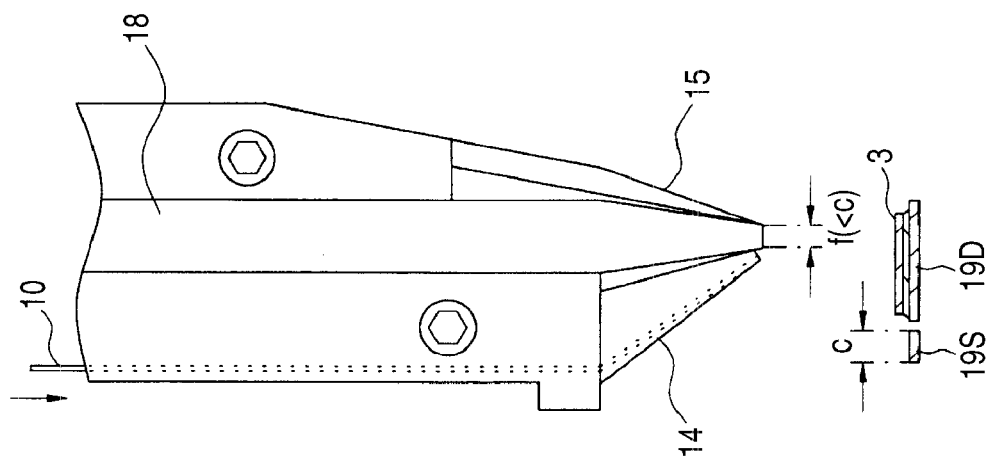
FIG. 28A is a side view showing the neighborhood of a point of the wedge tool which the present inventor examined.
Figure 29:
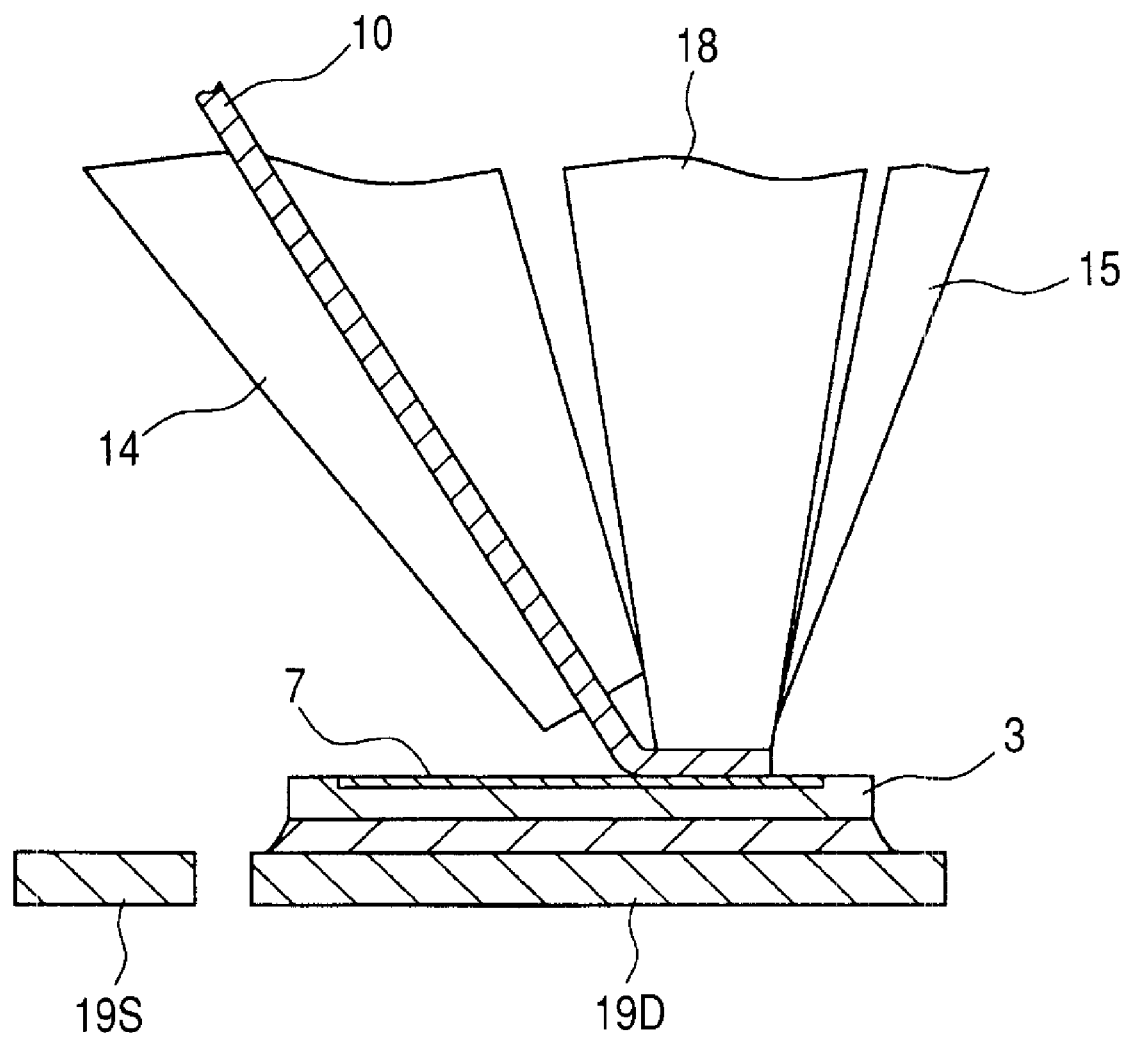
FIG. 29 is a principal part cross-sectional view showing the manufacturing method of the semiconductor device which the present inventor examined.
Figure 30:
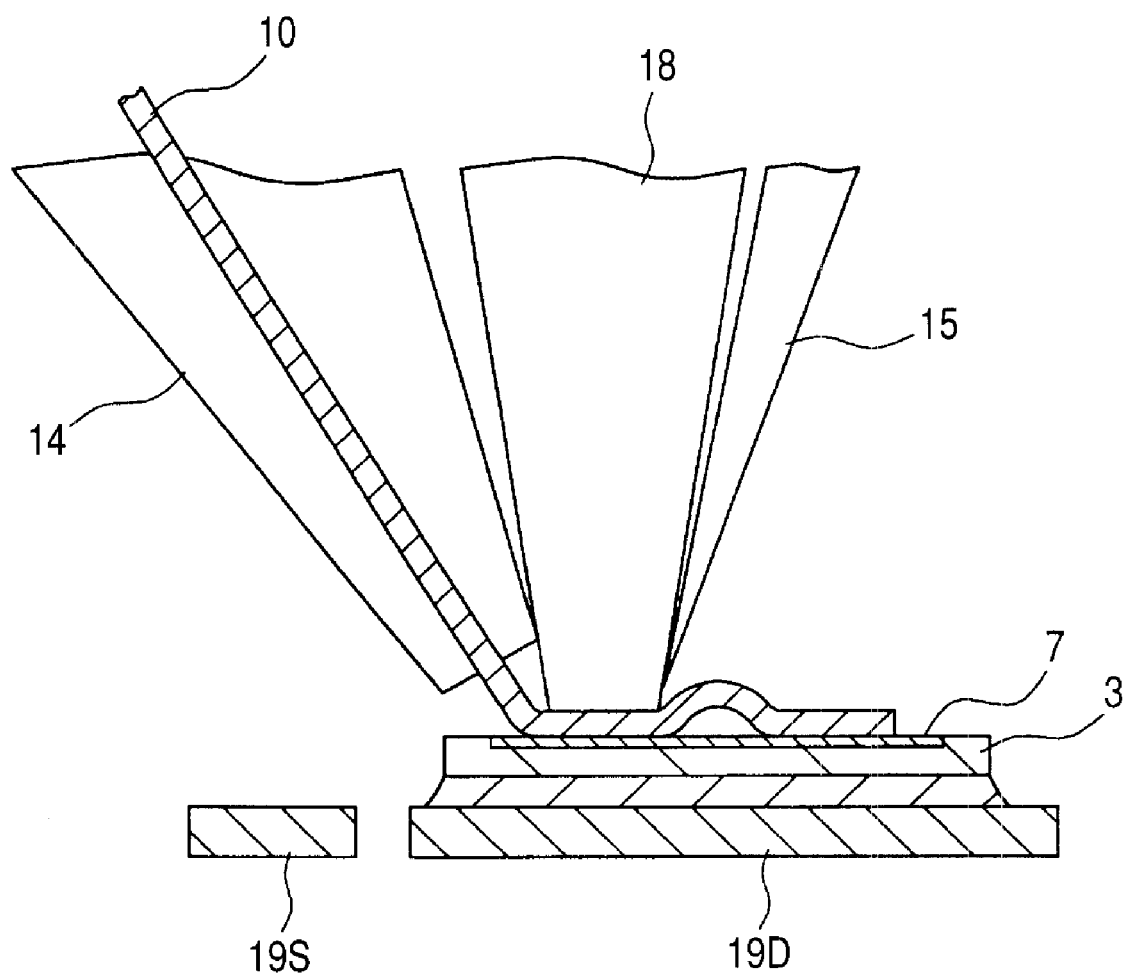
FIG. 30 is a principal part cross-sectional view showing the manufacturing method of the semiconductor device following FIG. 29.
Figure 31:
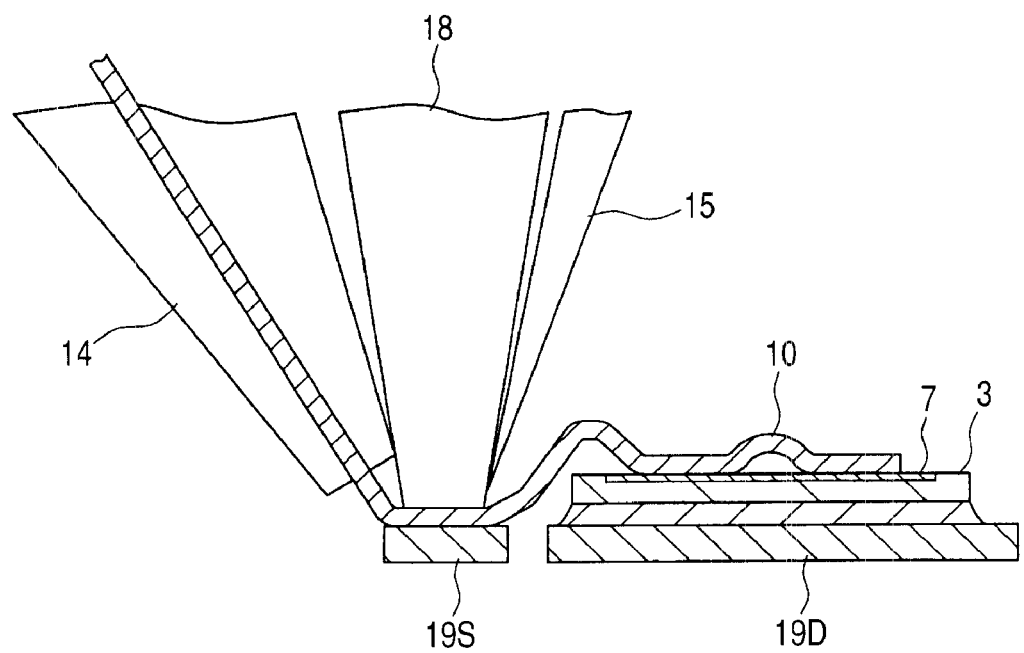
FIG. 31 is a principal part cross-sectional view showing the manufacturing method of the semiconductor device following FIG. 30.
Figure 32:
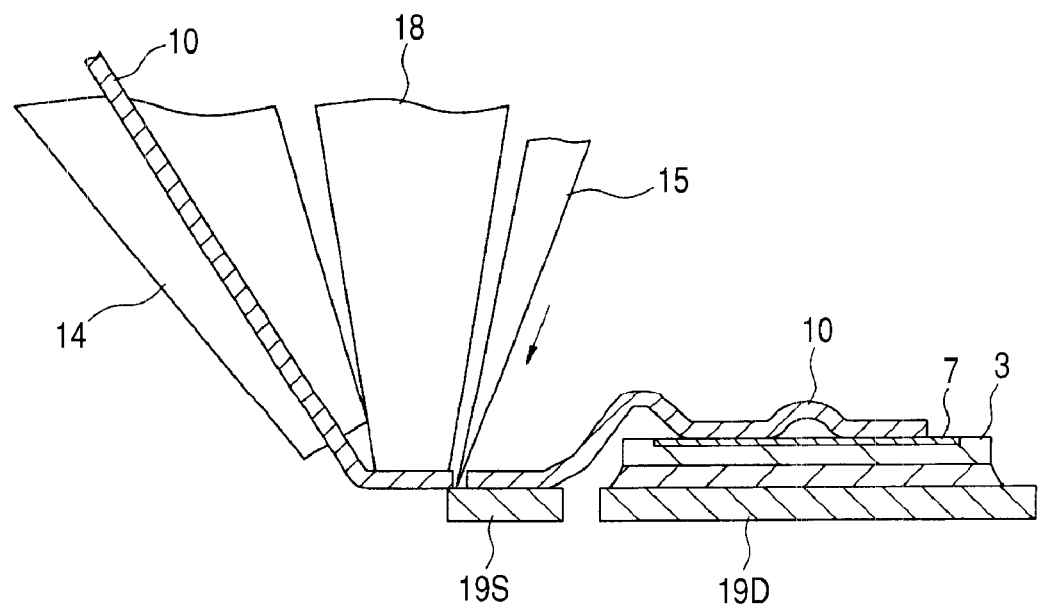
FIG. 32 is a principal part cross-sectional view showing the manufacturing method of the semiconductor device following FIG. 31.
Figure 33:
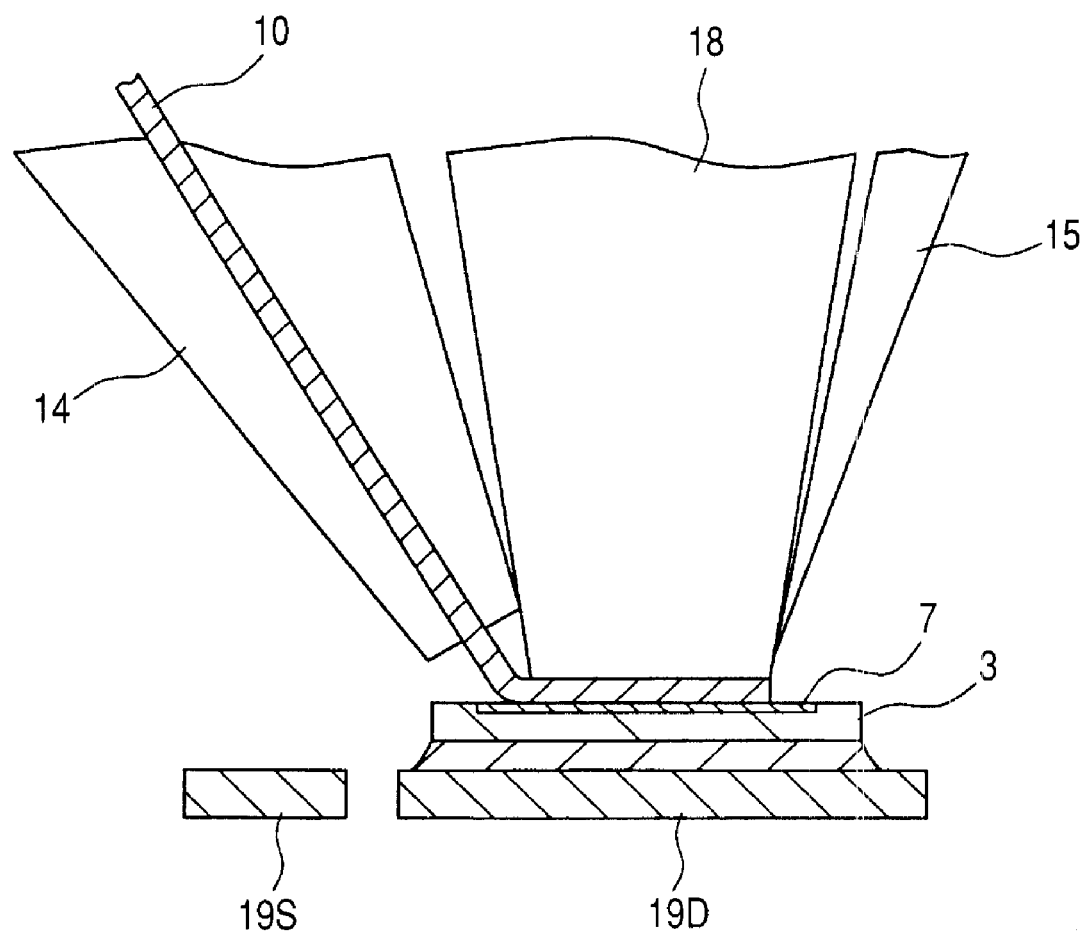
FIG. 33 is a principal part cross-sectional view showing another example of the manufacturing method of the semiconductor device which the present inventor examined.
Figure 34:
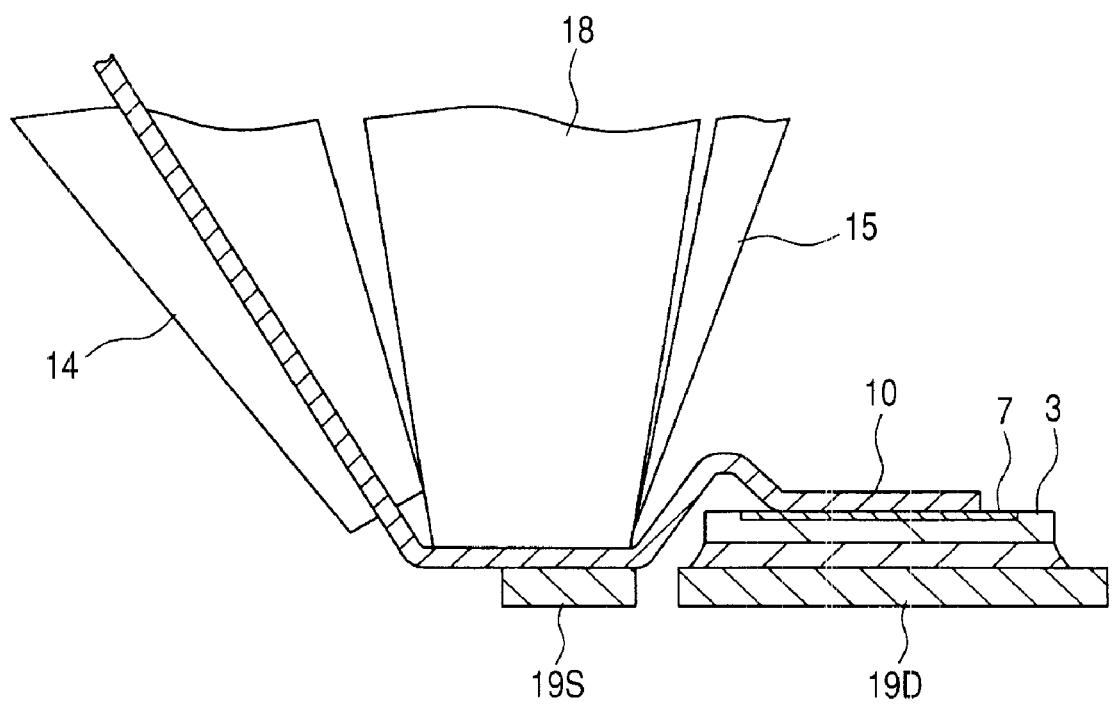
FIG. 34 is a principal part cross-sectional view showing the manufacturing method of the semiconductor device following FIG. 33.

The sectional shape of the long groove which branches the bottom of the wedge tool 12 is not limited to V-groove 13 like the embodiment, and arbitrary form, such as the U trench 16 as shown, for example in FIG. 26, and the square trench 17 as shown in FIG. 27, can be used for it.

In the embodiment, although the silicon chip 3 was mounted on the die pad part 4D using Ag paste 5, pellet attachment materials, for example, soldering paste, solder eutectics, etc. other than Ag paste 5 can also be used.

In the embodiment, bonding of the Al ribbon 10 was done to the source pad 7 of the silicon chip 3 with which power MOSFET was formed. However, when it is a chip which has a pad of the large area which can do bonding of the Al ribbon 10, it can be used even if it is the semiconductor chip in which elements other than power MOSFET were formed. For example, when it is the chip with which the insulated gate bipolar transistor (IGBT) was formed, in order to reduce the on resistance of IGBT, an emitter pad consists of area wider than a gate pad. Therefore, the present invention can be applied also when doing bonding of the Al ribbon to an emitter pad.

The form of a package is not limited to SOP8 and can be applied, for example to various small size surface mounting packages, such as VSON8 and WPAK.

The present invention relates to an effective technology in the application to the semiconductor device which connects a lead frame with the bonding pad of a semiconductor chip with a metallic ribbon.

What is claimed is:

1. A manufacturing method of a semiconductor device, comprising the steps of:
   (a) providing a lead frame which has a die pad part, and a first lead arranged near the die pad part;
   (b) providing a semiconductor chip in which a first pad is formed in a front surface;
   (c) mounting the semiconductor chip over the die pad part;
   (d) electrically connecting one end of a metallic ribbon to a front surface of the first pad by a wedge-bonding method using supersonic vibration;
   (e) electrically connecting another end of the metallic ribbon to a front surface of the first lead by the wedge-bonding method using supersonic vibration; and
   (f) sealing the semiconductor chip, the first lead, and the metallic ribbon with a resin;
   wherein in steps (d) and (e), a point of a wedge tool which applies the supersonic vibration to the metallic ribbon over the front surface of the first pad and the front surface of the first lead is divided into a first branch and a second branch by a groove extending along a pressing surface of the wedge tool in a first direction which intersects perpendicularly with a second direction which extends toward the first lead from the first pad,
   wherein in step (d), the one end of the metallic ribbon is electrically connected to the front surface of the first pad using the first and second branches of the wedge tool, and
   wherein in step (e), the other end of the metallic ribbon is electrically connected to the front surface of the first lead using the first branch but not the second branch of the wedge tool.

2. A manufacturing method of a semiconductor device according to claim 1, wherein
   the first lead includes a plurality of outer lead portions exposed to an outside of the resin, and a connecting part which connects the outer lead portions inside the resin; and
   the other end of the metallic ribbon is connected to the connecting part of the first lead.

3. A manufacturing method of a semiconductor device according to claim 1,
   wherein a width of the first branch in the first direction is narrower than a width of the first lead in the first direction.

4. A manufacturing method of a semiconductor device according to claim 1, wherein
   in step (c), the semiconductor chip is joined to the die pad part via Ag paste.

5. A manufacturing method of a semiconductor device according to claim 1, wherein
   a second pad whose area is smaller than the first pad is further formed in a front surface of the semiconductor chip;
   the lead frame has further a second lead arranged near the die pad part; and
   after step (e) and prior to step (f), a step of electrically connecting one end of an Au wire to a front surface of the second pad, and electrically connecting the other end of the Au wire to a front surface of the second lead is further included.

6. A manufacturing method of a semiconductor device according to claim 1, wherein
   the metallic ribbon includes Al.

7. A manufacturing method of a semiconductor device according to claim 1, wherein
   a power MOSFET is formed in the semiconductor chip, and the first pad includes a source electrode of the power MOSFET.

8. A manufacturing method of a semiconductor device according to claim 1, wherein
   the wedge tool is provided with a mechanism for decompressing an inside of the groove.

9. A manufacturing method of a semiconductor device according to claim 1,
   wherein a total width of the first branch, the second branch, and the groove in the second direction is the same as or less than a width of the first pad in the second direction.

10. A manufacturing method of a semiconductor device according to claim 1,
    wherein the metallic ribbon is a plurality of ribbons.

11. A manufacturing method of a semiconductor device according to claim 1, wherein step (e) includes cutting the metallic ribbon.

12. A manufacturing method of a semiconductor device according to claim 1, wherein an area of the first branch is different from an area of the second branch.

13. A manufacturing method of a semiconductor device according to claim 1,
    wherein an area of the first branch is narrower than an area of the second branch.

14. A manufacturing method of a semiconductor device according to claim 1,
    wherein a width of the first branch in the second direction is narrower than a width of the second branch in the second direction.

15. A manufacturing method of a semiconductor device according to claim 1,
    wherein a width of the first branch in the second direction is narrower than a width of the first lead in the second direction.

* * * * *